US012525468B2

(12) United States Patent
Rye et al.

(10) Patent No.: US 12,525,468 B2
(45) Date of Patent: Jan. 13, 2026

(54) INTEGRATED CLEAN AND DRY MODULE FOR CLEANING A SUBSTRATE

(71) Applicant: Applied Materials, Inc., Santa Clara, CA (US)

(72) Inventors: Jason A. Rye, Kalispell, MT (US); Adrian S. Blank, Gilroy, CA (US); Ekaterina Mikhaylichenko, San Jose, CA (US); Jagan Rangarajan, San Jose, CA (US); Jagadeeshkumar Sukumaran, Santa Clara, CA (US); Manikandan Jayaraman, Santa Clara, CA (US); Ricardo Martinez, Manteca, CA (US); Retheesh Muralidharan, Bangalore (IN)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/101,555

(22) Filed: Jan. 25, 2023

(65) Prior Publication Data
US 2024/0222152 A1  Jul. 4, 2024

Related U.S. Application Data

(60) Provisional application No. 63/436,271, filed on Dec. 30, 2022.

(51) Int. Cl.
*H01L 21/67* (2006.01)
*B08B 3/02* (2006.01)
(Continued)

(52) U.S. Cl.
CPC ........ *H01L 21/67028* (2013.01); *B08B 3/022* (2013.01); *B08B 3/123* (2013.01);
(Continued)

(58) Field of Classification Search
CPC ............ B08B 13/00; B08B 2203/0211; B08B 2203/0288; B08B 3/022; B08B 3/123;
(Continued)

(56) References Cited

U.S. PATENT DOCUMENTS 5,317,778 A   6/1994  Kudo et al.
5,738,574 A   4/1998  Tolles et al.
(Continued)

FOREIGN PATENT DOCUMENTS

CN   103262208 B   11/2017
CN   108335996 A    7/2018
(Continued)

OTHER PUBLICATIONS

International Search Report and Written Opinion in related application PCT/US2023/083494 dated Apr. 17, 2024.

*Primary Examiner* — Douglas Lee
(74) *Attorney, Agent, or Firm* — Patterson + Sheridan, LLP

(57) ABSTRACT

In one embodiment, a cleaning and drying module includes a process rotor having grip pins for holding a substrate. The process rotor rotates and moves between lowered and raised positions. A plurality of sweep arms each have a nozzle mechanism to apply a cleaning and/or drying fluid to the substrate. A collection rotor rotates synchronously with the process rotor. The collection rotor includes a collection weir defined by a bottom portion of the collection rotor and the inner surface. The collection weir collects fluids and particles from the process rotor and the substrate. Drain holes are positioned in the collection weir to drain fluids and particles from the collection weir. A rotor cover surrounds and extends above the sidewall of the collection rotor defining an annular volume between the rotor cover and the
(Continued)

collection rotor. An exhaust draws air through the drain holes and receives the collected fluids and particles.

16 Claims, 14 Drawing Sheets

(51) Int. Cl.
  *B08B 3/12* (2006.01)
  *B08B 13/00* (2006.01)
(52) U.S. Cl.
  CPC ....... *B08B 13/00* (2013.01); *B08B 2203/0211* (2013.01); *B08B 2203/0288* (2013.01)
(58) Field of Classification Search
  CPC ......... H01L 21/67028; H01L 21/67034; H01L 21/67051
  See application file for complete search history.

(56) References Cited

U.S. PATENT DOCUMENTS

| | | | |
|---|---|---|---|
| 5,860,181 A | 1/1999 | Maekawa et al. | |
| 6,156,124 A | 12/2000 | Tobin | |
| 6,220,941 B1 | 4/2001 | Fishkin et al. | |
| 6,308,361 B1 | 10/2001 | Matsuda et al. | |
| 6,350,188 B1 | 2/2002 | Bartlett et al. | |
| 6,435,941 B1 | 8/2002 | White | |
| 6,643,882 B1 | 11/2003 | Sotozaki et al. | |
| 6,648,979 B2 | 11/2003 | Lofaro et al. | |
| 6,684,890 B2 | 2/2004 | Nicolosi et al. | |
| 6,692,339 B1 | 2/2004 | Halley | |
| 6,811,618 B2 | 11/2004 | Kuroda | |
| 6,842,932 B2 | 1/2005 | Ishihara | |
| 6,843,257 B2 | 1/2005 | Yeo et al. | |
| 6,918,814 B2 | 7/2005 | Katsuoka et al. | |
| 7,170,190 B1 | 1/2007 | Treur et al. | |
| 7,614,939 B2 | 11/2009 | Tolles et al. | |
| 7,644,512 B1 | 1/2010 | Liu et al. | |
| 8,211,242 B2 | 7/2012 | Inoue et al. | |
| 8,226,771 B2 | 7/2012 | Oikawa et al. | |
| 8,276,291 B2 | 10/2012 | Liu et al. | |
| 8,322,963 B2 | 12/2012 | Hudgens et al. | |
| 8,739,429 B2 | 6/2014 | Liu et al. | |
| 8,769,842 B2 | 7/2014 | Ishibashi et al. | |
| 9,058,977 B2 | 6/2015 | Ishibashi | |
| 9,165,799 B2 | 10/2015 | Wang et al. | |
| 9,337,065 B2 | 5/2016 | Liu et al. | |
| 9,355,836 B2 | 5/2016 | Frank et al. | |
| 9,358,662 B2 | 6/2016 | Miyazaki et al. | |
| 9,412,627 B2 | 8/2016 | Nonaka | |
| 9,472,441 B2 | 10/2016 | Ogawa et al. | |
| 9,478,444 B2 | 10/2016 | Lyu et al. | |
| 9,610,673 B2 | 4/2017 | Torikoshi | |
| 9,700,988 B2 | 7/2017 | Yamaguchi et al. | |
| 10,002,777 B2 | 6/2018 | Kweon et al. | |
| 10,008,380 B2 | 6/2018 | Ishibashi et al. | |
| 10,040,166 B2 | 8/2018 | Nabeya et al. | |
| 10,043,653 B2 | 8/2018 | Chen et al. | |
| 10,090,189 B2 | 10/2018 | Ishibashi | |
| 10,395,949 B2 | 8/2019 | Ishibashi | |
| 10,446,416 B2 | 10/2019 | Mui et al. | |
| 10,486,285 B2 | 11/2019 | Miyazaki et al. | |
| 10,504,753 B2 | 12/2019 | Lin et al. | |
| 10,518,382 B2 | 12/2019 | Kweon et al. | |
| 10,573,509 B2 | 2/2020 | Maeda et al. | |
| 10,618,140 B2 | 4/2020 | Yamaguchi | |
| 10,737,301 B2 | 8/2020 | Ishibashi | |
| 10,991,602 B2 | 4/2021 | Fukaya et al. | |
| 11,094,548 B2 | 8/2021 | Kajita et al. | |
| 11,164,758 B2 | 11/2021 | Ishibashi | |
| 11,289,347 B2 | 3/2022 | Rangarajan et al. | |
| 11,660,643 B2 | 5/2023 | Ishibashi | |
| 11,705,354 B2 | 7/2023 | Hoey et al. | |
| 11,749,552 B2 | 9/2023 | Rangarajan et al. | |
| 11,766,756 B2 | 9/2023 | Miyazaki | |
| 2003/0026683 A1 | 2/2003 | Govzman et al. | |
| 2006/0003672 A1 | 1/2006 | Yoshida et al. | |
| 2008/0239308 A1 | 10/2008 | Ravid et al. | |
| 2009/0101181 A1* | 4/2009 | Morisawa | H01L 21/67173 134/115 R |
| 2009/0270015 A1 | 10/2009 | D'Ambra et al. | |
| 2012/0138091 A1* | 6/2012 | Rye | H01L 21/68792 134/10 |
| 2012/0285484 A1 | 11/2012 | Liu et al. | |
| 2012/0322345 A1 | 12/2012 | Rangarajan et al. | |
| 2015/0083038 A1* | 3/2015 | Furuya | G03F 7/3021 118/53 |
| 2019/0088510 A1 | 3/2019 | Ishibashi | |
| 2019/0221451 A1 | 7/2019 | Oh et al. | |
| 2020/0043756 A1* | 2/2020 | Rangarajan | B08B 3/022 |
| 2020/0066549 A1 | 2/2020 | Ishibashi | |
| 2021/0323117 A1 | 10/2021 | Rangarajan et al. | |
| 2022/0134505 A1 | 5/2022 | Golubovsky et al. | |
| 2023/0264319 A1 | 8/2023 | Golubovsky et al. | |
| 2023/0352337 A1 | 11/2023 | Rangarajan et al. | |

FOREIGN PATENT DOCUMENTS

| | | |
|---|---|---|
| CN | 108461415 A | 8/2018 |
| CN | 110369371 A | 10/2019 |
| CN | 111834259 A | 10/2020 |
| CN | 109346427 B | 1/2021 |
| CN | 112735984 A | 4/2021 |
| JP | 2001009387 A | 1/2001 |
| JP | 2002079190 A | 3/2002 |
| JP | 2002124504 A | 4/2002 |
| JP | 2002198345 A | 7/2002 |
| JP | 2003007666 A | 1/2003 |
| JP | 2004273530 A | 9/2004 |
| JP | 3668640 B2 | 7/2005 |
| JP | 3927936 B2 | 6/2007 |
| JP | 2009277811 A | 11/2009 |
| JP | 2010092928 A | 4/2010 |
| JP | 5349944 B2 | 11/2013 |
| JP | 5712061 B2 | 5/2015 |
| JP | 5932330 B2 | 6/2016 |
| JP | 6139326 B2 | 5/2017 |
| JP | 6276982 B2 | 2/2018 |
| JP | 6452940 B2 | 1/2019 |
| JP | 2019021859 A | 2/2019 |
| JP | 2019093474 A | 6/2019 |
| KR | 100632049 B1 | 10/2006 |
| KR | 100626959 B1 | 4/2007 |
| KR | 1020080096444 A | 10/2008 |
| KR | 101034236 B1 | 5/2011 |
| KR | 101388111 B1 | 4/2014 |
| KR | 101484120 B1 | 1/2015 |
| KR | 20150010630 A | 1/2015 |
| KR | 101538188 B1 | 7/2015 |
| KR | 1020170084073 A | 7/2017 |
| KR | 101801987 B1 | 12/2017 |
| KR | 20190117785 A | 10/2019 |
| KR | 102094281 B1 | 3/2020 |
| KR | 102184591 B1 | 12/2020 |
| TW | I509721 B | 11/2015 |
| WO | 2018124211 A1 | 7/2018 |
| WO | 2019208265 A1 | 10/2019 |
| WO | 2020150072 A1 | 7/2020 |
| WO | 2022010555 A1 | 1/2022 |

\* cited by examiner

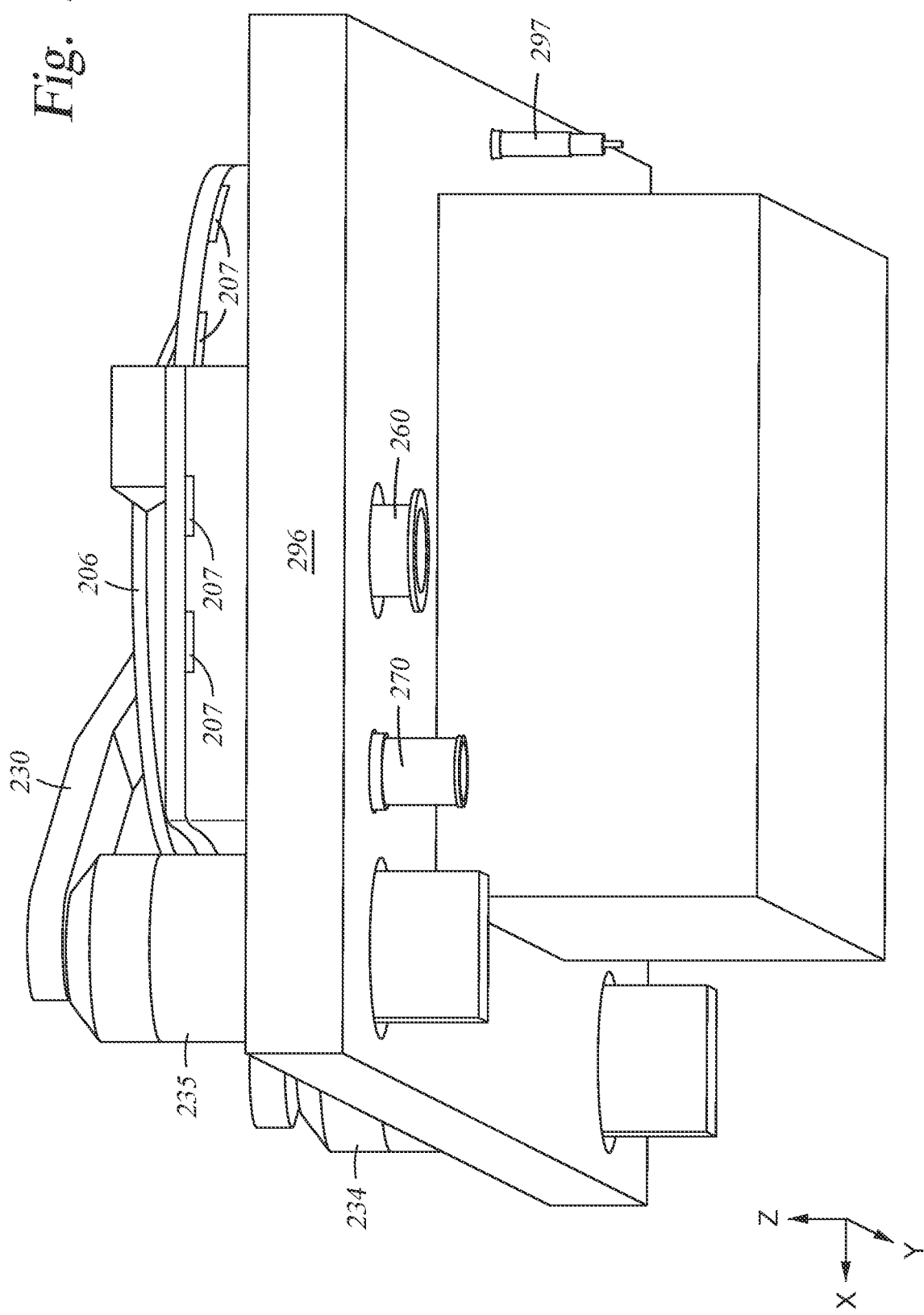

INTEGRATED CLEAN AND DRY MODULE FOR CLEANING A SUBSTRATE

CROSS-REFERENCE TO RELATED APPLICATIONS

This application claims benefit of U.S. Provisional Patent Application Ser. No. 63/436,271, filed Dec. 30, 2022, which is incorporated herein by reference in its entirety.

BACKGROUND

Field

Embodiments of the present disclosure generally relate to apparatus and methods for cleaning processed substrates, and, more particularly, to an integrated clean and dry module which may be used to clean the surface of a substrate.

Description of the Related Art

Substrate processing units may perform chemical mechanical polishing (CMP), which is commonly used in the manufacturing of high-density integrated circuits to planarize or polish a layer of material deposited on a substrate. In a typical CMP process, a substrate is retained in a carrier head that presses the backside of the substrate towards a rotating polishing pad in the presence of a polishing fluid. Material is removed across the material layer surface of the substrate in contact with the polishing pad through a combination of chemical and mechanical activity which is provided by the polishing fluid and a relative motion of the substrate and the polishing pad. Typically, after one or more CMP processes are completed, a polished substrate is further processed by use of one or more post-CMP substrate processing operations in a CMP processing system. For example, the polished substrate may be further processed using one or more cleaning operations in a cleaning unit. Various cleaning operations may be performed in a cleaning unit having multiple cleaning stations, i.e., cleaning modules. Once the post-CMP operations are complete, the substrate can be removed from a CMP processing system and then delivered to the next device manufacturing system, such as a lithography, etch, or deposition system.

Typically, a substrate enters a cleaning unit of a CMP tool from a polisher and is inserted into and acted upon by one or more cleaning modules. Thereafter, the substrate is moved to a drying module. Because the substrate becomes increasingly "clean" as it moves through the process, the last transfer from a cleaning module to the drying module is the most critical because time and manipulation creates the most opportunity for oxidation and a contamination. In one example, particles may become deposited on the substrate as the substrate is delivered from the cleaning module to the dryer module. Accordingly, the post-CMP cleaning process may not provide optimum particle-free performance.

Moreover, during a final rinsing and drying operation performed in a conventional dryer module, a nozzle will typically flow a fluid, such as DI water, onto the substrate. The water flowing onto the substrate can splash and create a spray that then splash back onto the surface of the substrate. The splash back of the spray onto the substrate can bead up especially on hydrophobic surfaces. During a later drying phase, the water can evaporate to leave a watermark. Watermarks can be the result of an outline of the water bead that can contain a redeposit of the particles that were intended to be removed by the rinse operation. Alternatively, these watermarks can be the result of hydrolysis of the DI water, producing small amounts of hydroxide ion, which, in the presence of oxygen, allow the silicon substrate to oxidize, creating an oxide deposit upon final drying.

Accordingly, what is also needed is an improved final drying process in the final cleaning module.

SUMMARY

In one example embodiment, a cleaning and drying module comprises a process rotor having a plurality of grip pins configured to releasably hold a substrate. The process rotor is configured to rotate and to move between a lowered position and a raised position. A plurality of sweep arms each have a nozzle mechanism configured to apply a cleaning and/or drying fluid to the substrate. A collection rotor is configured to rotate synchronously with the process rotor. The collection rotor defines processing volume between the process rotor and an interior of the collection rotor. The collection rotor comprises a sidewall extending above the process rotor in the lowered position, an inner surface of the sidewall being angled inward from a lower portion to an upper portion. The collection rotor further comprises a collection weir defined by a bottom portion of the collection rotor and the inner surface. The collection weir is configured to collect fluids and particles from the process rotor and the substrate. A plurality of drain holes are positioned in the collection weir proximate the inner surface of the sidewall. The drain holes are configured to drain the collected fluids and particles from the collection weir. A rotor cover surrounds and extends above the sidewall of the collection rotor defining an annular volume between the rotor cover and the collection rotor. The process rotor extends above the rotor cover in the raised position. An exhaust is in communication with the drain holes. The exhaust is configured to draw air from the processing volume and the annular volume through the drain holes and to receive the collected fluids and particles.

In another example embodiment, a cleaning and drying module comprises a process rotor having a plurality of grip pins configured to releasably hold a substrate. The process rotor is configured to rotate and to move between a lowered position and a raised position. At least one sweep arm has a nozzle mechanism configured to apply a cleaning and/or drying fluid to the substrate. A collection rotor is configured to rotate synchronously with the process rotor. The collection rotor defines a processing volume between the process rotor and an interior of the collection rotor. The collection rotor comprises a sidewall extending above the process rotor in the lowered position, an inner surface of the sidewall being angled inward from a lower portion to an upper portion. The collection rotor further comprises a collection weir defined by a bottom portion of the collection rotor and the inner surface. The collection weir is configured to collect fluids and particles from the process rotor and the substrate. A plurality of drain holes are positioned in the collection weir proximate the inner surface of the sidewall. The drain holes are configured to drain the collected fluids and particles from the collection weir. A rotor cover surrounds and extends above the sidewall of the collection rotor defining an annular volume between the rotor cover and the collection rotor. The process rotor extending above the rotor cover in the raised position. An exhaust is in communication with the drain holes. The exhaust is configured to draw air from the processing volume and the annular volume through the drain holes and to receive the collected fluids and particles. An enclosure covers the process rotor, the collection rotor, the rotor cover and the sweep arms. The enclosure comprises a first door on a first side of the enclosure and a second door on a second side of the enclosure different from the first side.

In another example embodiment, a method for cleaning a substrate in a cleaning and drying module is provided. The method comprises placing the cleaning and drying module in a first substrate transfer position in which: a process rotor thereof is in a raised position, a plurality of grip pins on the process rotor are in a substrate release position, a first door on a first side of an enclosure is opened, and a second door on second side of the enclosure different from the first side is closed. The method further comprises receiving a substrate through the first door on a plurality of stand-off pins on the process rotor. The method further comprises placing the cleaning and drying module in a substrate cleaning and drying position in which: the process rotor is in a lowered position, the plurality of grip pins are in a substrate gripping position, and the first and second doors are closed. The method further comprises performing a cleaning process on the substrate. The cleaning process comprises rotating the process rotor and the substrate gripped by the grip pins and applying a cleaning fluid to the substrate with a first nozzle mechanism mounted on a first sweep arm. The method further comprises performing a final rinse and dry process on the substrate. The final rinse and dry process comprises rotating the process rotor and the substrate gripped by the grip pins and applying at least one of a rinsing fluid and a drying fluid to the substrate with a second nozzle mechanism mounted on a second sweep arm. The method further comprises placing the cleaning and drying module in a second substrate transfer position in which: the process rotor is in the raised position, the plurality of grip pins on the process rotor are in a substrate release position and the substrate is supported on the stand-off pins, the first door is closed, and the second door is opened. The method further comprises allowing the substrate to be removed through the second door.

Embodiments of the disclosure include a cleaning and drying module comprising: a process rotor having a plurality of grip pins configured to releasably hold a substrate, the process rotor being configured to rotate and to move between a lowered position and a raised position; a plurality of sweep arms, each sweep arm having a nozzle mechanism configured to apply a fluid to the substrate; a collection rotor configured to rotate synchronously with the process rotor and defining a processing volume between the process rotor and an interior of the collection rotor, the collection rotor comprising: a sidewall extending above the process rotor in the lowered position, an inner surface of the sidewall being angled inward from a lower portion to an upper portion, a collection weir defined by a bottom portion of the collection rotor and the inner surface, the collection weir being configured to collect the fluid applied to the substrate, and a plurality of drain holes positioned in the collection weir proximate the inner surface of the sidewall, the drain holes configured to drain the collected fluid; a rotor cover surrounding and extending above the sidewall of the collection rotor defining an annular volume between the rotor cover and the collection rotor, the plurality of grip pins of the process rotor extending above the rotor cover when positioned in the raised position; and an exhaust in communication with the drain holes, the exhaust configured to draw air from the processing volume and the annular volume through the drain holes and to receive the collected fluid.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 5 is a bottom perspective view of the ICD module with the enclosure omitted, according to one or more embodiments.

Figure 1:
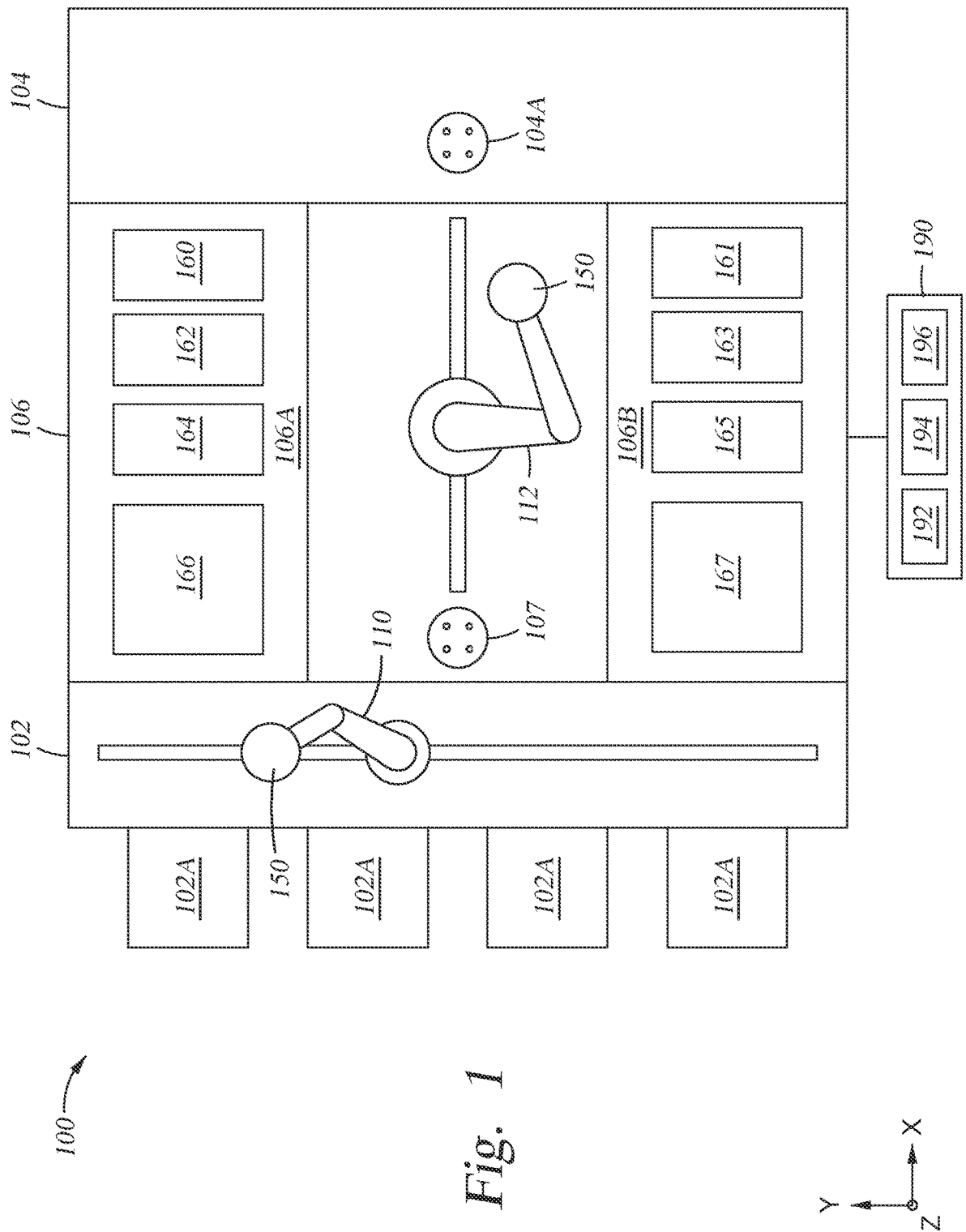
FIG. 1 is a schematic top view of an exemplary chemical mechanical polishing (CMP) processing system according to one or more embodiments.

To facilitate understanding, identical reference numerals have been used, where possible, to designate identical elements that are common to the figures. It is contemplated that elements disclosed in one embodiment may be beneficially utilized in other embodiments without specific recitation thereof with respect thereto.

DETAILED DESCRIPTION

Embodiments described herein generally relate to equipment used in the manufacturing of electronic devices, and more particularly, to an integrated cleaning and drying module which may be used to clean and dry the surface of a substrate in a semiconductor device manufacturing process.

FIG. 1 is a schematic plan view illustrating one embodiment of a chemical mechanical polishing (CMP) system 100, which uses an integrated clean and dry module (ICD) described herein. The CMP system 100 includes a factory interface 102, a polishing unit 104, and a cleaning unit 106. The factory interface 102 may include one or more loading stations 102A. The loading stations 102A may be, for example, FOUPs or cassettes. Each loading station 102A may include one or more substrates 150 for CMP processing in the CMP processing system 100. A first substrate handler 110 is provided to transfer substrates 150 between the loading stations 102A and the cleaning unit 106. The first substrate handler 110 may also transfer substrates 150 from the cleaning unit 106 to the loading stations 102A. A second substrate handler 112 is also provided to transfer substrates 150 between the cleaning unit 106 and the polishing unit 104. For example, the first substrate handler 110 transfers a substrate 150 from a loading station 102A to the cleaning system 106, e.g., to a cleaner pass-through 107, where the substrate 150 can be picked up by the second substrate handler 112.

As shown in FIG. 1, the cleaning unit 106 may be comprised of two cleaning units 106A, 106B disposed in parallel to one another on opposite sides of the second substrate handler 112. The cleaning unit 106A may include a plurality of modules, such as a first cleaning module 160, a second cleaning module 162, a third cleaning module 164, and a fourth cleaning module 166. The cleaning unit 106B may include a plurality of modules, such as a first module 161, a second module 163, a third module 165, and a fourth module 167.

The first cleaning module 160 may be, for example, a pre-clean module that performs a pre-clean process, such as a buffing process, on the substrate 150 before the substrate 150 is transferred therefrom using the second substrate handler 112. The second cleaning module 162 and the third cleaning module 164 may be, for example, any one or combination of contact and non-contact cleaning systems for removing polishing byproducts from the surfaces of the substrate 150 before the substrate 150 is transferred therefrom using the second substrate handler 112, such as in cleaning systems commonly referred to as spray boxes and/or scrubber brush boxes. The fourth cleaning module 166 may be, for example, a drying unit or a final cleaning and drying unit.

According to an embodiment, cleaning unit 106B may be essentially a mirror-duplicate of the cleaning unit 106A. In such a case, the first module 161 is similar to the first cleaning module 160, the second module 163 is similar to the second cleaning module 162, the third module 165 is similar to the third cleaning module 166, and the fourth module 167 is similar to the fourth cleaning module 166. Accordingly, the description herein and the depiction of cleaning unit 106A in the Figures is to be understood inferentially as also a description and depiction of cleaning unit 106B.

Alternatively, one or more of the first module 161, second module 163, third module 165, and fourth module 167 may be a module configured to perform a process other than a cleaning process. For example, one or more of the first module 161, second module 163, third module 165, and fourth module 167 may be a metrology station for measuring the thickness of a material layer disposed on the substrate 150 before and/or after polishing, to inspect the substrate 150 after polishing to determine if a material layer has been cleared from the field surface thereof, and/or to inspect the substrate surface for defects before and/or after polishing. As another example, one or more of the first module 161, second module 163, third module 165, and fourth module 167 may be a location specific (LSP) polishing module configured to polish only a portion of a substrate surface after the substrate 150 has been polished with a polishing module to touch up, e.g., remove additional material from, a relatively small portion of the substrate 150, for example, based on the measurement or surface inspection results obtained using a metrology station.

The cleaning units 106A, 106B may be separated by the cleaner pass-through 107 in which the second substrate handler 112 is positioned. The second substrate handler 112 may pick up the substrate 150 from the cleaner pass-through 107 and then transfer the substrate 150 to a transfer station 104A within the polishing unit 104. Following CMP processing on the substrate in the polishing unit 104, the second substrate handler 112 may retrieve the substrate 150 from the transfer station 104A within the polishing unit 104 and then transfer the substrate 150 to a first module 160 in the cleaning unit 106.

According to some embodiments, the second substrate handler 112 may also transfer the substrate 150 between the various modules (described above) of the cleaning units 106A, 106B. According to alternative embodiments, a third substrate handler (not shown) may be provided to transfer the substrate 150 between the various modules of the cleaning unit 106A, and a fourth substrate handler (not shown) may be provided to transfer the substrate 150 between the various modules of the cleaning unit 106B.

A controller 190, such as a programmable computer, is connected to elements of cleaning unit 106 and is configured to operate the elements of the cleaning module 106. For example, the controller 190 may control the loading, unloading and cleaning of substrates 150 by the cleaning unit 106.

The controller 190 can include a central processing unit (CPU) 192, a memory 194, and support circuits 196, e.g., input/output circuitry, power supplies, clock circuits, cache, and the like. The memory 194 and support circuits 196 are connected to the CPU 192. The memory 194 may be is a non-transitory computable readable medium, and can be one or more readily available memory such as random access memory (RAM), read only memory (ROM), floppy disk, hard disk, or other form of digital storage. In addition, although illustrated as a single computer, the controller 190 could be a distributed system, e.g., including multiple independently operating processors and memories. This architecture is adaptable to various cleaning situations based on programming of the controller 190 to control the order and timing that the substrates 150 are moved between the various modules of the cleaning unit 106, and to control individual operations of each of the various modules of the cleaning unit 106.

Figure 2A:
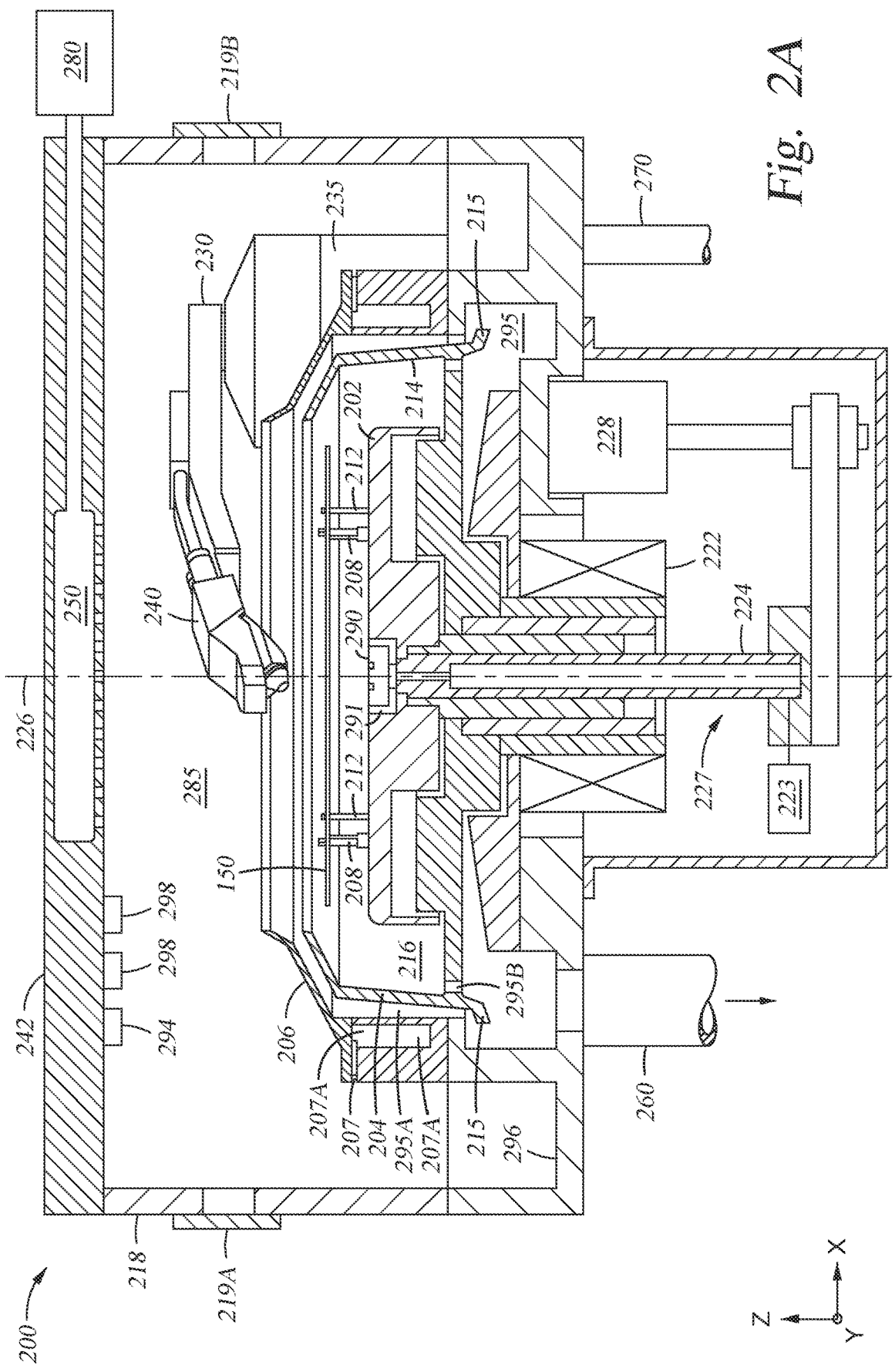
FIG. 2A is a cross-sectional view of an example of an integrated cleaning and drying (ICD) module in the CMP processing system with a process rotor thereof in a lowered position, according to one or more embodiments.
Figure 3:
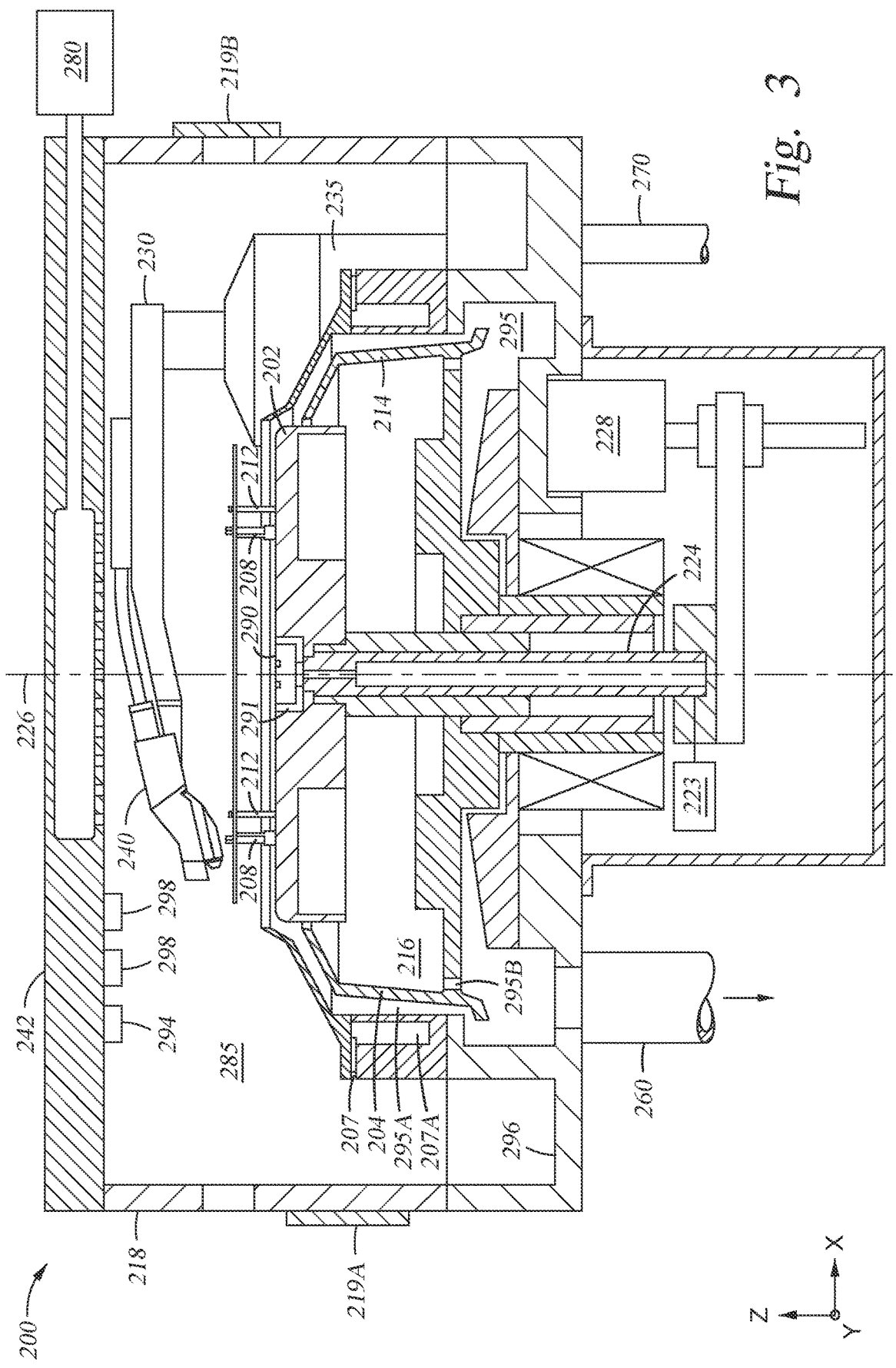
FIG. 3 is another cross-sectional view similar to FIG. 2A, with the process rotor in the raised position, according to one or more embodiments.

FIGS. 2A and 3 are cross sectional views of an exemplary integrated cleaning and drying (ICD) module 200, according to one or more embodiments. According to embodiments, the fourth cleaning module 166 may be implemented as the ICD module 200 described herein. As will be discussed further below, FIG. 2A illustrates the ICD module in a substrate processing configuration, and FIG. 3 illustrates the ICD module in a substrate loading/unloading configuration. The ICD module 200 may receive a substrate, e.g., substrate 150, to be subject to a final clean and dry process after the substrate 150 has been cleaned within one or more of the modules of the cleaning unit 106. The ICD module 200 may be utilized to remove contamination from the substrate 150 that if not removed, may result in the substrate 150 not meeting contamination and defect requirements. The ICD module 200 may also be utilized to remove residual moisture from the substrate 150 that if not removed, may lead to subsequent re-contamination of the substrate 150 when the substrate 150 is subject to further handling inside and/or outside of the CMP system 100.

The ICD module 200 includes a process rotor 202, collection rotor 204, rotor cover 206, first sweep arm 210, enclosure 218, first frontside nozzle mechanism 220, second sweep arm 230, second frontside nozzle mechanism 240, plenum 250, primary exhaust 260, secondary exhaust 270, and air intake 280, and underside nozzle mechanism 290. In one or more embodiments, the controller 190 (FIG. 1) may control the functionality of the ICD module 200.

The process rotor 202 includes a plurality of stand-off pins 208 extending from a top surface thereof. According to embodiments, three stand-off pins 208 are provided on the process rotor 202. The stand-off pins 208 are configured to support a substrate 150 that is delivered to the ICD module 200 by a substrate handler such as, for example, second substrate handler 112. Accordingly, the stand-off pins 208 may be evenly positioned around a circumference of the process rotor 202. The stand-off pins 208 may have an "L" shaped upper profile to provide support the substrate 150 and to ensure the substrate 150 is centrally positioned on the process rotor 202. The stand-off pins 208 may also have a minimal cross-section so as to have minimal contact points with the substrate 150 being supported.

Figure 2B:
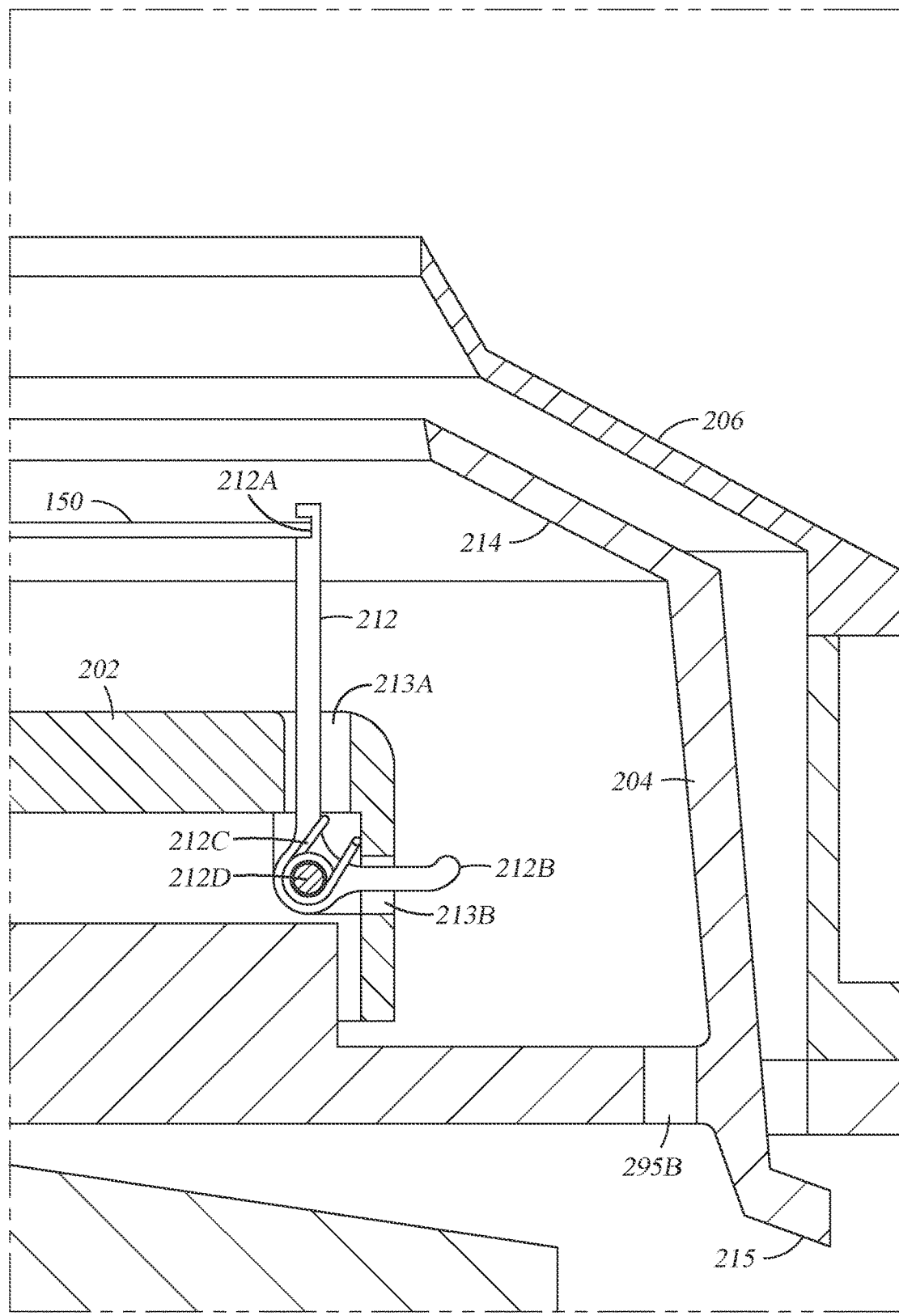
FIG. 2B is a detailed cross-sectional view of a portion of the ICD module with the process rotor in the lowered position, according to one or more embodiments.
Figure 2C:
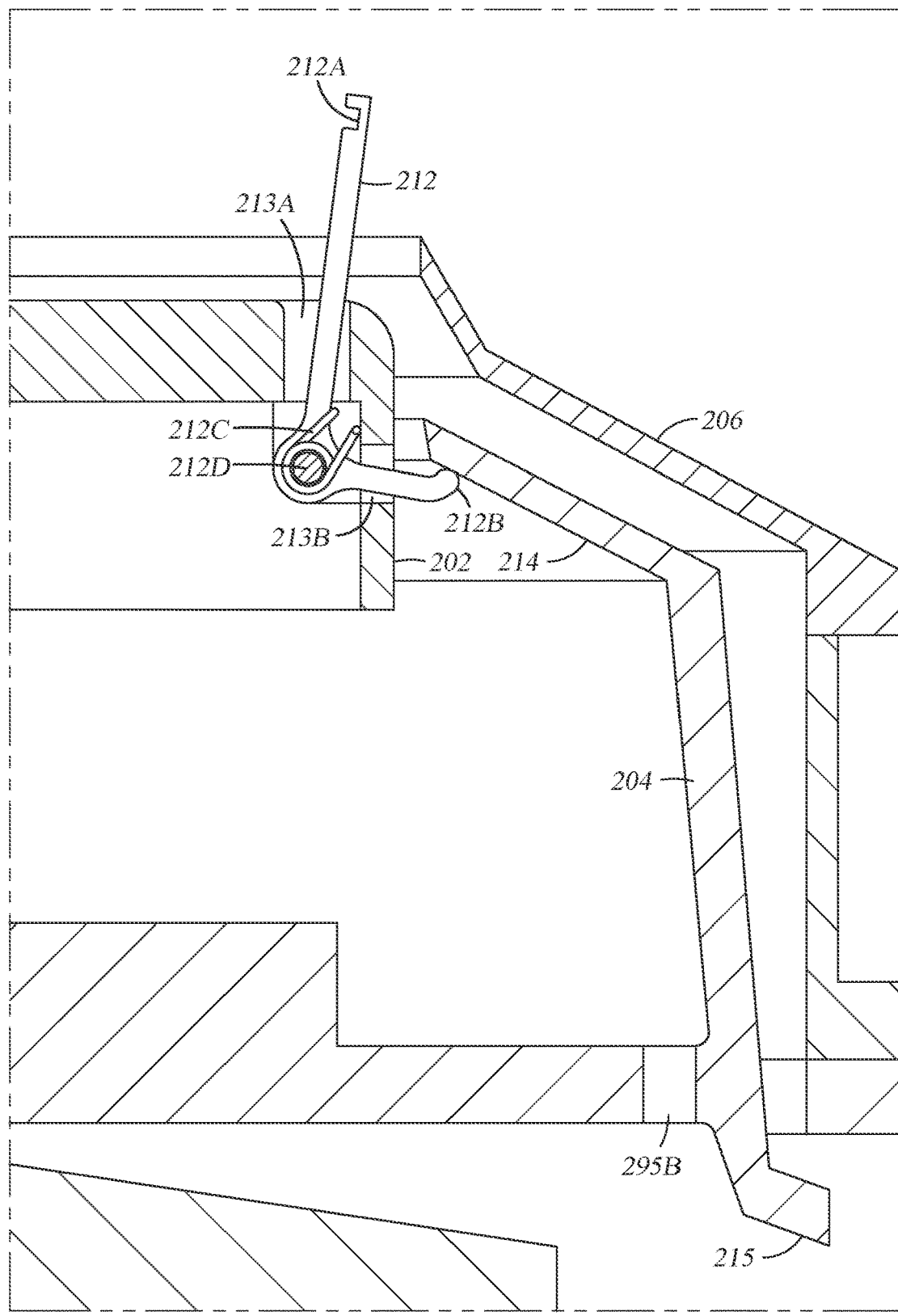
FIG. 2C is another detailed cross-sectional view similar to FIG. 2B, with the process rotor in a raised position, according to one or more embodiments.

The process rotor 202 also includes a plurality of grip pins 212. FIGS. 2B and 2C are detailed cross-sectional views of a portion of the ICD module 200 showing an example configuration of one of the grip pins 212. As illustrated in FIGS. 2B and 2C, the grip pin 212 extends from hole 213A in the top surface of the process rotor 202. A protruding element 212B extends from a lower portion of the grip pin 212 through hole 213B in a side surface of the process rotor 202. According to embodiments, the grip pin 212 is movable between a grip position (shown in FIG. 2B) and a release position (shown in FIG. 2C). For example, the grip pin 212 may pivot about grip pin axis 212D between the grip position and the release position. In the grip position shown in FIG. 2B, the upper portion of each grip pin 212 is positioned to grip the outer circumference of the substrate 150. In the release position shown in FIG. 2C, an upper portion of each grip pin 212 is positioned beyond an outer circumference of the substrate 150 so that the substrate 150 can be received on the process rotor 202, i.e., on the stand-off pins 208 (or removed from the process rotor 202). The grip pins 212 may be biased towards the grip position by, for example, spring 212C. The grip pins 212 may also include a shaped area configured to receive the substrate 150. For example, each grip pin 212 may include a notch 212A shaped to receive an edge of the substrate 150.

The grip pins 212 may grip, or hold, the substrate 150 during the cleaning process. FIG. 4B shows a top view of the process rotor 202 with an example arrangement of the grip pins 212 and stand-off pins 208. According to some embodiments, the grip pins 212 may be evenly arranged around the top surface of the process rotor 202 at an angle α relative to one another as measured in a plane that is generally parallel to the top surface of the process rotor 202 (e.g., X-Y plane). The angle α, that is, the angular position of the grip pins 212 from each other, may be approximately 120°. Alternatively, the grip pins 212 may be oriented less than 120° from each other or greater than 120° from each other. Further, the total number of grip pins 212 may be three or more. Alternatively, the total number of grip pins 212 is four or more. The grip pins 212 may have minimal contact with the substrate 150 along the edge of the substrate 150 such that the grip pins 212 do not collect a significant amount of a fluid at a contacting interface and impede the cleaning process of the substrate 150.

The process rotor 202 is movable between a raised position and a lowered position by use of lift assembly 227 that includes the second drive motor 228 and shaft 224. In FIGS. 2A and 2B, the process rotor 202 is shown in the lowered position, and in FIGS. 2C and 3, the process rotor 202 is shown in the raised position. In the raised position, the process rotor 202 can receive the substrate 150, as the stand-off pins 208 and the grip pins 212 are above a top portion of the collection rotor 204 and the rotor cover 206. As can be seen in FIG. 2C, the protruding element 212B is configured to contact an annular inner surface 214 of the collection rotor 204 when the process rotor 202 is moved towards the raised position. As the process rotor continues to move to the raised position, the annular inner surface 214 applies pressure to the protruding element 212B, which overcomes the biasing force of the spring 212C and imparts an outward rotational motion onto one or more of the grip pins 212, thereby moving the grip pins to the release position. Similarly, when the process rotor 202 is moved to the lowered position, the protruding element 212B of each grip pin 212 no longer contacts the surface 214 of the collection rotor 204, and the grip pins 212 rotate to the grip position that causes the substrate to be retained between the grip pins 212. The lowered position is also referred to herein as the processing position at which the clean and drying process is performed.

As noted above, the collection rotor 204 includes annular inner surface 214. The annular inner surface 214 defines a processing volume 216 within the ICD module 200. For example, the substrate 150 may be cleaned within the processing volume 216. Further, the annular inner surface 214 has an angled portion that is symmetric about a rotational axis 226 of the process rotor 202 and the collection rotor 204.

A first drive motor 222 may be coupled to the process rotor 202 via shaft 224. The first drive motor 222 rotates the process rotor 202 and the collection rotor 204 about rotational axis 226. That is, controller 190 may control the first drive motor 222 to rotate the process rotor 202 and the collection rotor 204 at various rotational speeds set by process recipes contained the memory 194 of the controller 190. The first drive motor 222 may be referred to as a rotation motor. The process rotor 202 and the collection rotor 204 may be rotationally fixed relative to each other, i.e., configured to rotate together.

Further, the second drive motor 228 may also be coupled to the process rotor 202 via shaft 224. The second drive motor 228 may impart linear motion to the process rotor 202 along the rotational axis 226 by use of a ball-screw assembly that is configured to create linear motion of the process rotor 202 due to relative rotational motion created by the second drive motor 228 rotating the shaft 224 relative to a portion of the collection rotor 204. That is, controller 190 may control the second drive motor 228 to move the process rotor 202 in the Z direction between the raised position and lowered position. In addition, the second drive motor 228 may be used to move the process rotor 202 in the Z direction in preparation for, or during, a cleaning, rinsing, and/or drying process to precisely position the substrate 150 at a desired distance from first and second nozzle mechanisms 220, 240 or position relative to the surface of the collection rotor 204. Thus, the second drive motor 228 may be configured to move the rotor 202 in the Z direction while the rotor 202 is spinning and/or while the substrate 150 is being subject to cleaning, rinsing, and/or drying. The second drive motor 228 may be referred to as a linear actuator. Further, the second drive motor 228 may be one of a hydraulic, pneumatic, electro-mechanical, and a magnetic motor. The linear movement of the process rotor 202 may be independent of movement of the collection rotor 204.

The grip pins 212 hold the substrate 150 when the process rotor 202 is in the lowered position, as described above. When the process rotor 202 is in the lowered position, the first drive motor 222 may rotate the process rotor 202 while cleaning fluids are applied to the substrate 150 for cleaning. Cleaning fluids may be applied to an upper surface of the substrate 150 by the first nozzle mechanism 220 and the second nozzle mechanism 240, and to a lower surface of the substrate 150 via an underside nozzle mechanism 290, while the process rotor 202 and the collection rotor 204 are rotated. Because the collection rotor 204 is rotated with the process rotor 202, backsplash of the cleaning fluids against the inner surface 214 may be mitigated.

Cleaning and/or rinsing fluids may be delivered to the underside nozzle mechanism 290 via shaft 224, which is coupled to a fluid source 223. In one or more embodiments, cleaning and/or rinsing fluids may flow onto a backside of substrate 150 through the underside nozzle mechanism 290. The cleaning and/or rinsing fluids may be a rinsing agent (e.g., de-ionized water or ozonated water) or a cleaning chemical. Further, the cleaning and/or rinsing fluids may be provided from the fluid source to the underside nozzle mechanism 290 via shaft 224.

The process rotor 202 may include a drain 291 adjacent the underside nozzle mechanism 290 to allow fluid applied to the backside of substrate 150 to drain (described below). According to embodiments, the drain 291 may be an annulus arranged circumferentially around underside nozzle mechanism 290. The drain 291 feeds through shaft 224 to an aspirate connection (not shown), which may apply a negative pressure to drain 291 to ensure complete drainage of fluid.

A first sweep arm drive motor 234 may be coupled to the first sweep arm 210. The first sweep arm drive motor 234 is configured to move the first sweep arm 210 in an arcuate path that is parallel to a surface of the wafer 150, during the cleaning process, such that the cleaning fluids output by the first nozzle mechanism 220 are evenly distributed over the surface of the substrate 150. The first sweep arm drive motor 234 may also be configured to move the first sweep arm 210 axially to set a distance between the first nozzle mechanism 220 and the surface of the substrate 150. For example, the first sweep arm drive motor 234 may include an air cylinder for raising and lowering the first nozzle mechanism 220.

Similarly, a second sweep arm drive motor 235 may be coupled to the second sweep arm 230. The second sweep arm drive motor 235 is configured to move the second sweep arm 230 in an arcuate path that is parallel to a surface of the wafer 150, during the cleaning process, such that the cleaning fluids output by the second nozzle mechanism 240 are evenly distributed over the surface of the substrate 150. The second sweep arm drive motor 235 may also be configured to move the second sweep arm 230 axially to set a distance between the second nozzle mechanism 240 and the surface of the substrate 150. For example, the second sweep arm drive motor 235 may include an air cylinder for raising and lowering the second nozzle mechanism 240.

The first and second sweep arms 210, 230 may each include one or more tubes to deliver fluids to the first and second nozzle mechanisms 220, 240, respectively. According to an embodiment, the first and second sweep arms 210, 230 each include connections 210A for delivering fluids and/or electrical signals (e.g., control signals) to the first and second nozzle mechanisms 220, 240, respectively. For example, water and isopropyl alcohol (IPA) may be separately delivered to the first and second nozzle mechanisms 220, 240 via connections 210A. For example, the first and second sweep arms 210, 230 may also each include a connection 210A for supplying control signals from the controller 190 to the first and second nozzle mechanisms 220, 240, respectively.

The first and second nozzle mechanisms 220, 240 may each include one or more non-contact cleaning or drying technologies. Each of the first and second nozzle mechanisms 220, 240 may have one, two, three or more nozzles that each may output a media that is any combination of liquid or gas. One or more of the first and second nozzle mechanisms 220, 240 may be a megasonic nozzle, fluid jet nozzle, mist nozzle, high pressure nozzle, or a kinetic energy nozzle. The megasonic nozzle includes one or more elements, such as a piezoelectric element, configured to alternatively apply compression and rarefaction to the cleaning fluid in an alternating fashion according to a sinusoidal or other pattern to generate a megasonic actuated fluid. For example, the megasonic nozzle may be configured to alternatively applying compression and rarefaction in a sinusoidal pattern at a rate of 950 kHz to generate the megasonic actuated fluid. Alternatively, other frequencies may be used.

According to an embodiment, where one of the first and second nozzle mechanisms 220, 240 is a megasonic nozzle, the other of the first and second nozzle mechanisms 220, 240 may be configured to apply a chemical cleaning agent, a rinsing agent (e.g., DI water), and/or a drying agent (e.g., IPA vapor). For example, according to the embodiment illustrated in FIG. 4A, first nozzle mechanism 220 may be a drying nozzle configured to apply a drying agent such as isopropyl alcohol (IPA) and/or de-ionized water, and second nozzle mechanism 240 may be a megasonic nozzle that is configured to provide de-ionized water and megasonic energy to the surface of the substrate during processing. In some configurations, the second nozzle mechanism 240 may also be configured to apply a chemical cleaning agent, a rinsing agent, and/or a drying agent As noted, the cleaning, rinsing, and/or drying fluids may be provided to the first and second nozzle mechanisms 220, 240 via connections 210A. The number of connections may be based on the number of nozzles within the nozzle mechanism being used and/or the number of different types of cleaning chemical, rinsing agents and/or drying agents utilized by the first and second nozzle mechanisms 220, 240. For example, where the first and second nozzle mechanisms 220, 240 are each configured to output two different cleaning fluids, two different connections 210A may be utilized for each first and second nozzle mechanisms 220, 240. Further, the flow rate of the different cleaning chemistries and/or rinsing agents through different nozzles may be varied. For example, the flow rate of a cleaning chemical, rinsing agent or drying agent from a first one of the nozzles may be different than the flow rate of a cleaning chemical, rinsing agent or drying agent from a second one of the nozzles. Alternatively, the flow rate of a cleaning chemical, rinsing agent or drying agent from at least one of the nozzles may be varied during a cleaning process, a rinsing process, and/or a drying process.

The first and second sweep arms 210, 230 may include a coupling arrangement for fastening the first and second nozzle mechanisms 220, 240 thereto, respectively. According to embodiments, the coupling arrangement between the first and second nozzle mechanisms 220, 240 and the first and second sweep arms 210, 230 may be an industry standard coupling arrangement, and one or both of the first and second nozzle mechanisms 220, 240 may be commercially available nozzles. For example, the second nozzle mechanism 240 may be a megasonic nozzle head supplied by KAIJO®. Each nozzle mechanism 220, 240 can be readily replaced as needed depending on a desired application or for repair and/or routine maintenance.

The path of the first and second sweep arms 210, 230 during a cleaning process may be an arcuate path that is parallel to a front surface of the substrate 105. Alternatively, other shapes and/or lengths of paths may be utilized. For example, the range of motion of the first and second sweep arms 210, 230 may be varied. According to some embodiments, the first and second nozzle mechanisms 220, 240 respectively coupled to the end of first and second sweep arms 210, 230 may pass over the center of the substrate 150 in an arcuate path. The position of the first and second sweep arms 210, 230 and/or the first and second nozzle mechanisms 220, 240 may be adjusted to ensure that the first and second nozzle mechanisms 220, 240 passes over the center of a rotating substrate 150 during processing. Further, the nozzle mechanisms 220, 240 may be moved relative to the corresponding first and second sweep arms 210, 230 to vary the position of the first and second nozzle mechanisms 220, 240 relative to surface of the substrate 150. Further, the axial distance between first and second nozzle mechanisms 220, 240 and the surface of the substrate 150 may be varied to aid in the cleaning process.

The first and second nozzle mechanisms 220, 240 may include a mass flow controller to provide mass flow control of fluids being sprayed on the substrate 150, depending on a desired cleaning, rinsing, and/or drying process. The nozzle mechanisms 220, 240 may also include a vaporizer for vaporizing IPA or water being sprayed on the substrate 150, depending on a desired cleaning, rinsing and/or drying process. The nozzle mechanisms 220, 240 may also be configured to blow air only, depending on a desired cleaning process. For example, the cleaning, rinsing, and/or drying process may optionally include a cycle in which one or both of the nozzle mechanisms 220, 240 blow air to dry the stand-off pins 208 and the grip pins 212.

According to an embodiment, enclosure 218 may cover the ICD module 200, i.e., defining an interior volume 285 of the ICD module 200. Alternatively, the ICD module 200 may be "open" to the rest of the cleaning unit 106, i.e., the ICD module alternatively does not include an enclosure 218. In such an alternative embodiment, the face of the substrate 150 is exposed to atmosphere (of the cleaning unit 106) while being processed within the ICD module 200.

According to embodiments with enclosure 218 covering the ICD module 200, doors 219A, 219B may selectively open to provide access to the interior volume 285 of the cleaning module 200 for inserting or removing the substrate 150 from the ICD module 200. In one or more embodiment, during cleaning processing the doors 219A, 219B are closed to seal the ICD module 200 relative to the factory interface 102 and the cleaning unit 106. When both doors 219A, 219B are closed, the interior volume 285 of the ICD module 200 may be isolated from the remainder of the cleaning unit 106, such that, for example fumes, liquids or particles generated and/or used elsewhere in the cleaning unit 106 or the polishing unit 104 do not enter the ICD module 200 during the cleaning process. Similarly, any fumes or liquids used and/or generated during the cleaning process in the ICD module 200 are removed from the cleaning module 200 in a controlled manner via the primary exhaust 260 and/or the secondary exhaust 270 so as to prevent fumes, liquids or particles generated and/or used during cleaning processing in the ICD module 200 to not enter the factory interface 102 or elsewhere in the cleaning unit 106. The ICD module 200 is in a substrate processing configuration when both doors 219A, 219B are closed and the process rotor 202 is in the processing position with the grip pins 212 holding the substrate 150.

The enclosure 218 may also include a substrate sensor 294 in communication with, for example, to confirm whether a substrate 150 is properly positioned within the ICD module 200. The enclosure may also include ion bars 298 or the like to prevent static charge buildup in the interior of the ICD module 200.

The primary exhaust 260 and/or the secondary exhaust 270 may be utilized to remove excess moisture and/or all fluids from the ICD module 200 during and/or after a cleaning cycle. In one embodiment, moisture flows through drain holes 295B and into the primary exhaust 260. For example, as the substrate 150 is rotated, the drain holes 295B are configured to ensure that moisture does not collect on the substrate 150 and is removed via the primary exhaust 260. In one embodiment, one or more O-rings or other sealing members may be positioned where the primary exhaust 260 meets the enclosure 218. In FIG. 5, one primary exhaust 260 and one secondary exhaust 270 are shown on one side of the ICD module 200. According to embodiments, the opposite side of the ICD module may also include a second primary exhaust 260 and a second secondary exhaust 270, arranged in a mirror configuration to that shown in FIG. 5. That is, the ICD module 200 may have two primary exhausts 260, one on each lateral side of the ICD module 200. Likewise, the ICD module 200 may have two secondary exhausts 270, one on each lateral side of the ICD module 200.

According to an embodiment, door 219A may be on a side of the enclosure 218 facing the factory interface 102 (FIG. 1), i.e., at a position in which first substrate handler 110 can receive substrate 150. Additionally, door 219B may be on a side of the enclosure 218 facing an interior of the cleaning unit 106, i.e., at a position in which second substrate handler 112 can insert substrate 150 into the ICD module 200. During a substrate loading process, door 219B is opened such that substrate 150 may be inserted into the ICD module 200, while door 219A is closed to isolate the factory interface 102 from the interior of the ICD module 200 and the cleaning unit 106. The ICD module 200 is in a substrate loading configuration when door 219A is closed, door 219B is open, process rotor 202 is in the raised position, and the grip pins 212 are in the release position.

Further, during a substrate unloading process, door 219A is opened such that substrate 150 may be extracted from the ICD module 200, while door 219B is closed to continue to isolate the factory interface 102 from the interior of the ICD module 200 and the cleaning unit 106. The ICD module 200 is in a substrate unloading configuration when door 219A is open, door 219B is closed, process rotor 202 is in the raised position, and the grip pins 212 are in the release position.

Positive air flow through the interior volume 285 and processing volume 216 may be provided by a fan/filter unit (FFU) 242. The FFU 242 may be connected to the enclosure 218, for example. The FFU 242 includes air intake 280 and plenum 250. The air intake 280 may include, for example, a HEPA filter and a fan. Air flows from the air intake 280, through the plenum 250, into the interior volume 285 and processing volume 216, and out the primary exhaust 260 and the secondary exhaust 270.

An annular collection weir 295 may be formed below an outer portion of the collection rotor 204. The primary exhaust 260 is connected to the collection weir 295. An annular space 295A is defined between an outer surface of the collection rotor 204 and an inner surface of the rotor cover 206. Accordingly, air provided by the FFU 242 can also flow through the annular space 295A, into the collection weir 295, and out the primary exhaust 260. According to embodiments, this configuration may allow for a high volume of laminar air flow through the annular space 295A between the rotor cover 206 and the collection rotor 204, which may reduce the amount of residual vapors and liquid droplets created during processing and disposed within this region, and thus reduce substrate contamination and improve the cleaning process. Additionally, any liquid that may inadvertently be introduced into the annular space 295A can drain out the primary exhaust 260, assisted by the air flow through the annular space 295A.

A plurality of drain holes 295B may be formed in a base of the collection rotor 204. For example, according to embodiments, the drain holes 295B may be formed near the inner surface 214 of the collection rotor 204. The drain holes allow fluids applied during a cleaning process of a substrate 150 to drain out of the collection rotor 204 and into the collection weir 295. According to an embodiment, the inner surface 214 of the collection rotor 204 includes a portion angled inward with respect to vertical from a lower portion to an upper portion. This configuration may improve fluid drainage from the processing volume 216 due to rotation of the collection rotor 204. According to some embodiments, the plurality of drain holes 295B are configured to enable a laminar flow of air to flow over the surface of a substrate and through the inner region of the collection rotor 204 and drain holes 295B to reduce the amount of residual vapors and liquid droplets created during processing and disposed within this region, and thus reduce substrate contamination and improve the cleaning process. Additionally, air provided by the FFU 242 can also flow through the processing volume 216, into the drain holes 295B, into the collection weir 295, and out the primary exhaust 260. According to embodiments, this configuration may provide for a high volume of air flow through the processing volume 216, which may provide for improved cleaning processing.

Additionally, according to some embodiments, the collection rotor 204 may include rotor extension 215 extending diagonally downward and outward from the lower portion of the collection rotor 204. The rotor extension 215 (FIG. 2A) may further improve fluid drainage from the processing volume by drawing and guiding the fluids from the drain holes 295B as the collection rotor 204 rotates. The rotor extension 215 is generally configured to extend past the outer edge of the drain holes 295B and past the outer diameter of the collection rotor at the level of the drain holes 295B.

The rotor cover 206 includes a plurality of vent openings 207 (FIG. 2A) and annular duct 207A that are used to evacuate regions of the interior volume 285. Each of the plurality of vent opening 207 connects the interior volume 285 to the annular duct 207A. The secondary exhaust 270 is connected to the annular duct 207A via a channel (not shown) formed in the drain pan 296. Accordingly, air provided by the FFU 242 can flow through the vent openings 207, into the annular duct 207A of the rotor cover 206, and out the secondary exhaust 270. According to embodiments, this configuration may provide for a high volume of air flow through the perimeter of the rotor cover 206 and into the vent openings 207, which will reduce the amount of residual gases and vapors created during processing and disposed within this outer region of the ICD module 200. The residual vapors and gases can include IPA vapors, water vapor and/or cleaning chemistry vapors created or dispensed into the interior volume 285 during processing. In some embodiments, the secondary exhaust 270 can be coupled to a scrubbed exhaust that is adapted to remove residual gases and vapors, which can be important to remove vapors that have an airborne permissible exposure limit (PEL), lower explosive limit (LEL) and/or upper explosive limit (UEL), such as IPA. Additionally, any liquid that may inadvertently be introduced into the annular duct 207A can drain out the secondary exhaust 270, assisted by the air flow through the annular duct 207A.

The plenum 250 may be configured to control the air flow within the ICD module 200 to minimize re-circulation. For example, the plenum 250 may increase and/or decrease the amount of air flowing into the ICD module 200 to minimize re-circulation. The air flow re-circulation can be minimized due to, for example, the configuration of the collection rotor 204, the rotor cover 206, the vent openings 207, the annular duct 207A, the collection weir 295, the primary exhaust 260, the secondary exhaust 270, and the air intake 280 disclosed herein.

In one embodiment, during the cleaning process, uniform air flow across the surface of the substrate 150 is primarily generated by the primary exhaust 260 and the plenum 250. In various embodiments, the primary exhaust 260 is configured to provide a path for air to flow out of the ICD module 200 to prevent particles from reattaching to the surface of the substrate 150. As is described above, air may be provided to the plenum 250 by the air intake 280, and exhausted from the ICD module 200 by the primary exhaust 260 and the secondary exhaust 270. The plenum 250 may be a shower head style plenum. Further, the geometry of the primary exhaust 260, the shape of the collection rotor 204, the shape of the rotor cover 206, and/or the shape of the collection weir 295 may be optimized to reduce re-circulation within the ICD module 200. Reducing re-circulation at least minimizes re-attachment of particles and any vaporized cleaning fluids on the substrate. The geometry of the collection rotor 204, the rotor cover 206, and the collection weir 295 may define the annular volume 295, which may be optimized to minimize re-circulation. Further, primary exhaust 260 and secondary exhaust 270 provide paths for the cleaning fluids and rinsing fluids to be removed from the ICD module 200, minimizing re-circulation within the ICD module 200. The plenum 250 may be positioned proximate the first and second nozzle mechanisms 220, 240, and the substrate 150 may be positioned between the plenum 250 and the primary exhaust 260.

The rotor cover 206 also includes two nozzle cups 225 (FIG. 4A) respectively positioned on opposite sides of the top surface of the rotor cover 206. The nozzle cups 225 are each configured and positioned to receive one of the nozzle mechanisms 220, 240. That is, when nozzle mechanism 220 is not in use, such as, for example, when the ICD module is in the substrate loading or unloading configuration during transfer of a substrate 150 into or out of the ICD module 200 or when a current cleaning processing step does not require use of nozzle mechanism 220, the first sweep arm motor 234 positions the first sweep arm 210 so that the corresponding first nozzle mechanism 220 is positioned in one of the nozzle cups 225. Similarly, when nozzle mechanism 240 is not in use, such as, for example, when the ICD module is in the substrate loading or unloading configuration during transfer of a substrate into or out of the ICD module 200 or when a current cleaning processing step does not require use of nozzle mechanism 240, the second sweep arm motor 235 positions the second sweep arm 230 so that the corresponding second nozzle mechanism 240 is positioned in the other one of the nozzle cups 225.

Figure 4A:
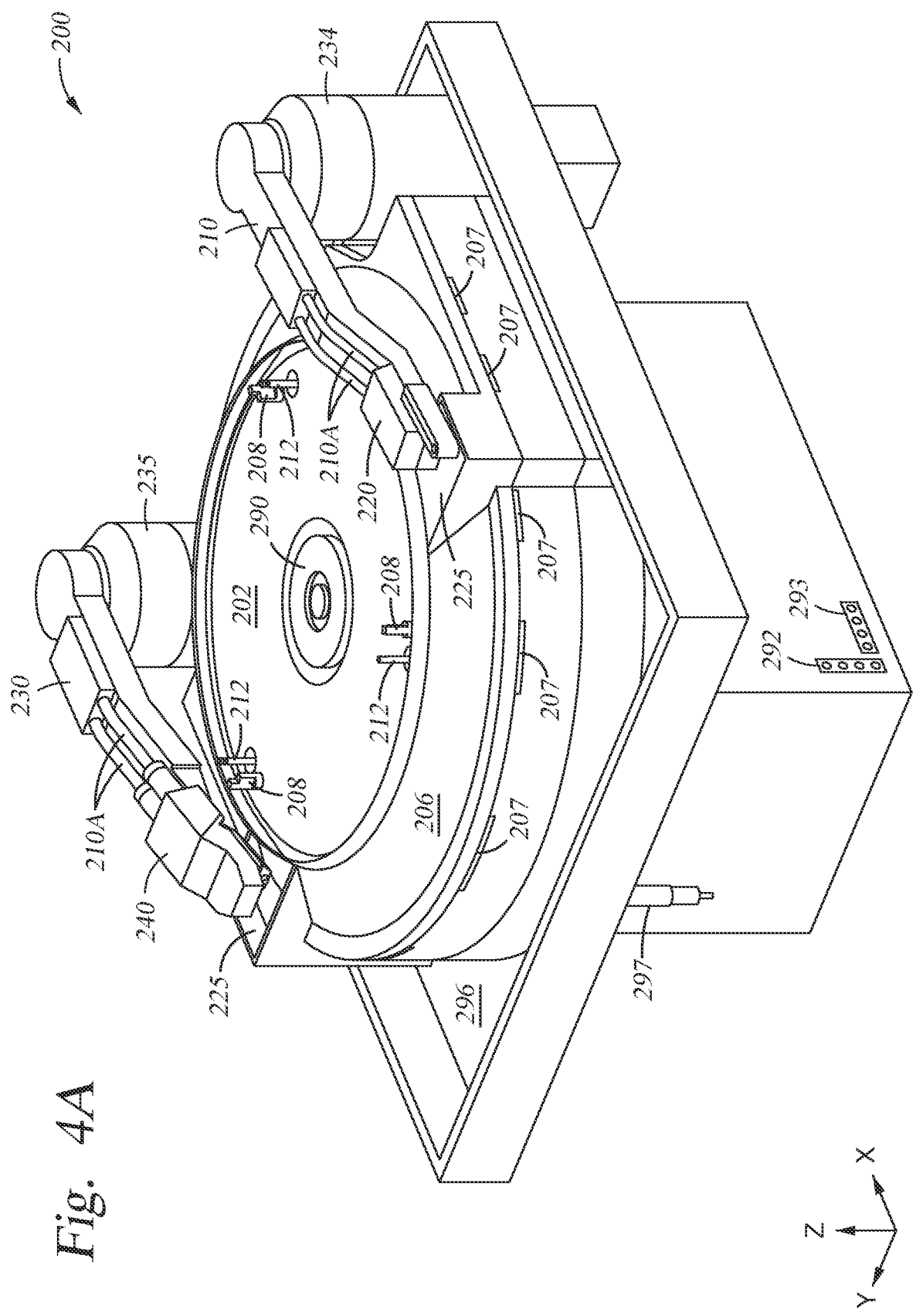
FIG. 4A is a top perspective view of the ICD module with an enclosure thereof omitted, according to one or more embodiments.
Figure 4B:
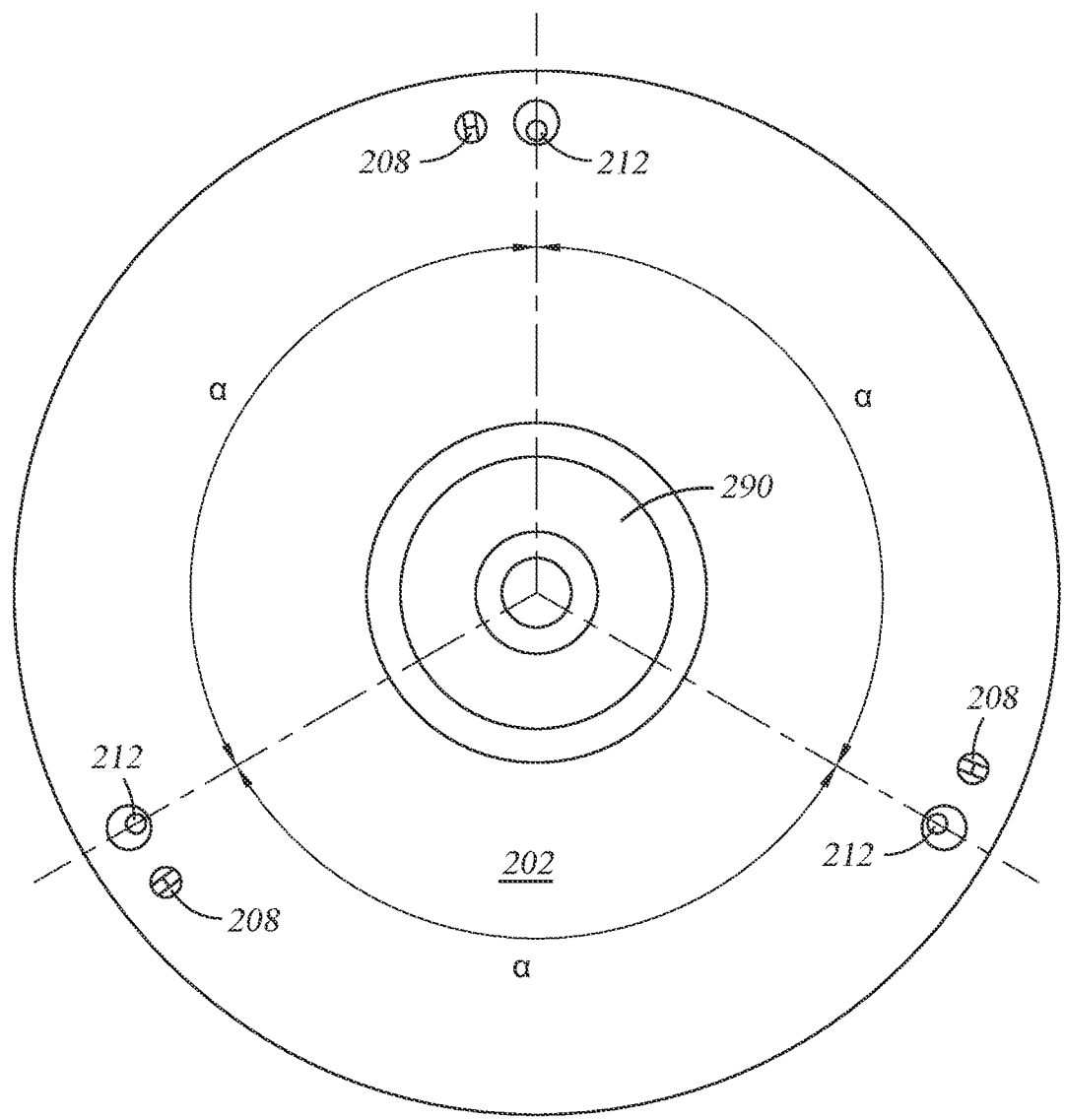
FIG. 4B is a top view of a process rotor of the ICD module, according to one or more embodiments.

FIG. 4A illustrates a top perspective view of the ICD module 200 with the enclosure 218 omitted. FIG. 5 illustrates a bottom perspective view of the ICD module 200, also with the enclosure 218 omitted. It is intended that all cleaning liquids applied during a cleaning processing are contained within the collection rotor 204 and the rotor cover 206 and drained through the primary exhaust 260 and/or the secondary exhaust. 270. However, cleaning liquids may inadvertently leak outside of the collection rotor and the rotor cover 206 due to, for example, failure or defect in one or more components. Accordingly, to prevent contamination of the exterior of the ICD module 200 in case of an inadvertent leak, a drain pan 296 is provided surrounding the perimeter of the rotor cover 206. An interior surface of drain pan 296 can be seen in FIG. 4A and an exterior surface of drain pan can be seen in FIG. 5. A leak detect sensor 297 may also be positioned in the base of the drain pan 296. The leak detect sensor 297 may provide an alert to an operator in the event that a leak is detected in the drain pan 296.

According to some embodiments, the footprint of the ICD module 200 in the X-Y plane is substantially square or rectangular. In some embodiments, the ICD module 200 may be sized to perform cleaning processing on a 300 mm diameter substrate 150 while having a footprint of approximately 550 mm×550 mm. In some embodiments, a longest side of the ICD module 200 may be less than approximately twice the diameter of the substrate 150. In some embodiments, an overall height of the ICD module 200 may be approximately 500 mm. In some embodiments, an overall height of the ICD module may be less than approximately one and two thirds times the diameter of the substrate 150. A conventional cleaning module may need a relatively large size to provide sufficient internal volume in order to properly ventilate the interior during cleaning processing. In contrast, the ICD module 200 according to embodiments disclosed herein can be relatively small to allow multiple ICD modules 200 to be stacked and/or reduce the footprint of the cleaning unit 106. The relatively small size may be due to, for example, the high rate of air flow from the air source 280 through the ICD module 200 and out the primary and secondary exhausts 260, 270.

The ICD module 200 may include one or more inlet connections 292. The inlet connections 292 provide a path for the cleaning fluids to be provided to the ICD module 200 during a cleaning process. The cleaning fluids may be provided to, for example, the first nozzle mechanism 220, second nozzle mechanism 240, the underside nozzle mechanism 290, and/or the fluid source 223. Further, the ICD module 200 may include electrical connections 293 configured to couple to power and/or communication cables external to the ICD module 200.

Figure 6:
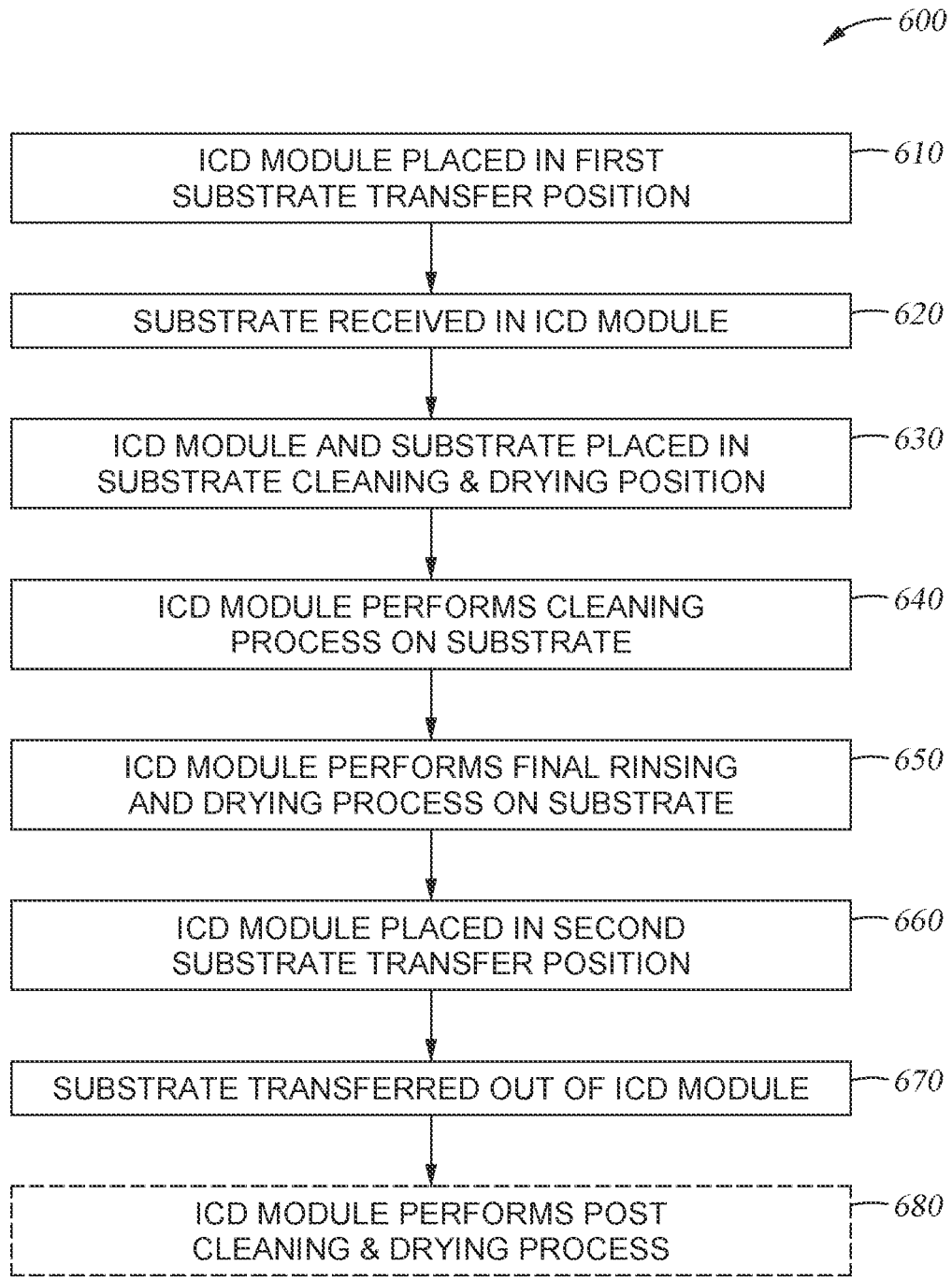
FIG. 6 is an example sequence of operations performed in an ICD module, according to one or more embodiments.

FIG. 6 illustrates a method 600 for cleaning a substrate (e.g., substrate 150), in the ICD module 200 described above, according to one or more embodiments. At operation 610, the ICD module 200 is placed in a first substrate transfer position. As described above, for example, the second drive motor 228 raises the process rotor 202 to the raised position, and the grip pins 212 are rotated to the release position. Further, for example and as described above, door 219B, i.e., the door facing an interior of the cleaning unit 106, is opened, and door 219A, i.e., the door facing the factory interface 102, remains closed. Further, for example and as described above, the first and second sweep arm motors 234, 235 control the first and second sweep arms 210, 230, respectively to position the first and second nozzle mechanisms 220, 240 over the nozzle cups 225. The controller 190 may provide instructions to, for example, the second drive motor 228, door 219A, first and second sweep arm motors 234, 235 in connection with placing the ICD module 200 in the first substrate loading position.

At operation 620 of method 600, a substrate 150 is received in the ICD module 200 for cleaning and drying processing. For example, according to embodiments such as described above, the second substrate handler 112 inserts a substrate 150 through the open door 219B such that the substrate 150 rests on the stand-off pins 208. After the substrate 150 has been fully inserted into the ICD module and loaded onto the stand-off pins 208, the substrate handler 112 releases the substrate 150 and is retracted from the ICD module 200. According to embodiments, for example, the controller 190 may provide instructions to the substrate handler 112 to place the substrate 150 on the stand-off pins 208 and then retract. The controller 190 may also receive indicia from, for example, substrate sensor 294 that the substrate 150 is properly received in the ICD module 200.

At operation 630 of method 600, the ICD module 200 and the substrate 150 held therein are placed in a substrate cleaning and drying position. For example, according to embodiments such as described above, door 219A is closed (and door 219B remains closed). Further, for example and as described above, the second drive motor 228 lowers the process rotor 202 to the lowered position, and the grip pins 212 are rotated to the gripping position to grip the substrate 150. According to embodiments, for example, the controller 190 may provide instructions to the second drive motor 228 and the door 219A in connection with placing the ICD module and the substrate 150 in the substrate cleaning and drying position.

At operation 640 of method 600, the ICD module 200 performs a cleaning process on the substrate 150 held therein in the substrate cleaning and drying position. For example, according to embodiments such as described above, first drive motor 222 rotates the process rotor 202 and the collection rotor 204 at a predetermined rotational speed. Additionally, for example and as described above, the second sweep arm motor 235 rotates the second sweep arm 230 and second nozzle mechanism 240 through a predetermined angle sweep over the substrate 150 held on the process rotor 202 by the grip pins 212. Additionally, for example and as described above, the second drive motor 228 and/or the second sweep arm motor 235 may also adjust a distance in the Z direction between the second nozzle mechanism 240 and the upper surface of the substrate 150 to a predetermined distance. Additionally, for example and as described above, the second nozzle mechanism 240 applies a megasonic cleaning fluid to the upper surface of the substrate 150 while the substrate 150 is rotated by the process rotor 202 and while the second sweep arm 230 is rotated through the predetermined angle sweep. When the cleaning process is complete, the second sweep arm motor 235 rotates the second sweep arm 230 so that the second nozzle mechanism 240 is positioned in its corresponding nozzle cup 225. According to embodiments, for example, the controller 190 may provide instructions to the first drive motor 222, the second drive motor 228, the second sweep arm motor 235, and/or the second nozzle mechanism 240 in connection with performing the cleaning process on the substrate 150.

Additionally, for example and as described above, the underside nozzle mechanism 290 applies a rinsing fluid such as de-ionized water to the underside surface of the substrate 150. According to some embodiments, backside nozzle mechanism 290 applies the rinsing fluid to the underside surface of the substrate 150 as part of the cleaning process (i.e., operation 640) performed on the substrate 150. Alternatively, backside nozzle mechanism 290 applies the rinsing fluid to the underside surface of the substrate 150 as part of the final rinse and dry process (i.e., operation 650 described below) performed on the substrate 150.

At operation 650 of method 600, the ICD module 200 performs a final rinse and dry process on the substrate 150 held therein in the substrate cleaning and drying position. For example, according to embodiments such as described above, first drive motor 222 continues to rotate the process rotor 202 and the collection rotor 204 at a predetermined rotational speed. Additionally, for example and as described above, the first sweep arm motor 234 rotates the first sweep arm 210 and first nozzle mechanism 220 through a predetermined angle sweep over the substrate 150 held on the process rotor 202 by the grip pins 212. Additionally, for example and as described above, the second drive motor 228 and/or the first sweep arm motor 234 may also adjust a distance in the Z direction between the first nozzle mechanism 220 and the upper surface of the substrate 150 to a predetermined distance. Additionally, for example and as described above, the first nozzle mechanism 220 applies a rinsing and/or drying fluid to the upper surface of the substrate 150 while the substrate 150 is rotated by the process rotor 202 and while the first sweep arm 210 is rotated through the predetermined angle sweep. For example, application of the rinsing and/or drying fluid may include applying de-ionized water to the substrate 150. For example, application of the rinsing and/or drying fluid may also include applying vaporized IPA. According to some embodiments, applying de-ionized water and vaporized IPA are provided simultaneously or sequentially. According to some embodiments, the vaporized IPA is delivered to positions that are inboard (i.e., closer to the substrate center) of the position of the DI water as the two nozzles are moved from the center to the edge of the substrate.

After a predetermined time and/or after a predetermined amount of rinsing and/or drying fluid are applied by the first nozzle mechanism 220 to the substrate 150, the first nozzle mechanism 220 stops applying the rinsing and/or drying fluid, and the substrate 150 continues to be rotated by the process rotor 202 at a predetermined rotational speed for a predetermined time. For example, while no further fluids are being applied to the substrate 150, the process rotor 202 rotates at approximately 2,000 RPM for a predetermined time. Due to rotation of the process rotor 202 and collection rotor 204, fluids applied to the substrate 150 are urged towards the inner surface 214 of collection rotor 204 and then through drain holes 295B and into the collection weir 295. The collected fluids and air supplied from the fan/filter unit 242 are then pulled into primary exhaust 260 for exhaust processing. When the final rinse and dry process is complete, the first sweep arm motor 234 rotates the first sweep arm 210 so that the first nozzle mechanism 220 is positioned in its corresponding nozzle cup 225. Additionally, the first drive motor 222 stops rotating the process rotor 202 and the collection rotor 204. According to embodiments, for example, the controller 190 may provide instructions to the first drive motor 222, the second drive motor 228, the first sweep arm motor 234, and/or the first nozzle mechanism 220 in connection with performing the final rinse and dry process on the substrate 150.

At operation 660, the ICD module 200 is placed in a second substrate transfer position. As described above (and similar to the first substrate transfer position), for example, the second drive motor 228 raises the process rotor 202 to the raised position, and the grip pins 212 are rotated to the release position and the substrate 150 is released from the grip pins and are supported by the stand-off pins 208. Further, for example and as described above, door 219A, i.e., the door facing the factory interface 102, is opened, and door 219B, i.e., the door facing an interior of the cleaning unit 106, remains closed. This is in contrast with the first substrate transfer position in which door 219B is opened and door 219A remains closed. Further, for example and as described above, the first and second sweep arm motors 234, 235 control the first and second sweep arms 210, 230, respectively to position the first and second nozzle mechanisms 220, 240 over the nozzle cups 225. The controller 190 may provide instructions to, for example, the second drive motor 228, door 219A, first and second sweep arm motors 234, 235 in connection with placing the ICD module in the second substrate loading position.

At operation 670, the substrate 150 is transferred from the ICD module 200 to the factory interface 102. For example, according to embodiments such as described above, first substrate handler 110 grips the substrate 150 and removes it through the open door 219A. The controller 190 may receive sensor data from the sensing device 294 indicating that the substrate 150 has been removed from the ICD module 200 and initiate a new process in response to the sensor data.

Additionally, the ICD module 200 may undergo additional processing during the method 600. For example, at operation 680, the ICD module may perform a post-cleaning and drying process after the substrate 150 is removed. For example and as described above, at least one of the first and second sweep arm motors 234, 235 may move a respective one of the first and second sweep arms 210, 230 so that the respective one of the first and second nozzle mechanisms 220, 240 are at a position corresponding to a circumferential position of the stand-off pins 208 and the grip pins 212. Further, the at least one of the corresponding first and second nozzle mechanisms 220, 240 may apply a drying fluid such as air or other gas while the first drive motor 222 rotates the process rotor 202 in order to dry the stand-off pins 208 and the grip pins 212.

Additionally or alternatively, an underside purge gas nozzle (not shown) may apply a purge gas to the underside of the process rotor 202 in order to dry the process rotor 202 and to push residual liquid from the underside of the process rotor 202 into drain 291 for drainage into collection weir 295.

One alternate embodiment of an ICD module 700 is depicted in FIGS. 7A, 7B, 8A, and 8B. Where ICD module 700 has similar features to ICD module 200 described above, the same reference numbers are used in the figures and redundant descriptions thereof are omitted. The primary difference between ICD module 700 and ICD module 200 is that ICD module 700 includes rotor cover 706 which differs from the rotor cover 206 of ICD module 200. For example, the rotor cover 706 is configured to be positioned at different positions in the Z-direction during, for example, cleaning, rinsing, and drying processing of substrate 150.

The rotor cover 706 includes flanges 701A, 701B, and 701C. The flanges 701A-C extend from an outer edge of the rotor cover 706 in the XY plane. Lifters 702A-C are positioned between the drip pan 296 and respective flanges 701A-C. The lifters 702A-C support the rotor cover 706. The lifters 702A-C are configured to move and position the rotor cover 706 between at least a lowered position, shown in FIGS. 7A and 8A, and a raised position, shown in FIGS. 7B and 8B.

Figure 8A:
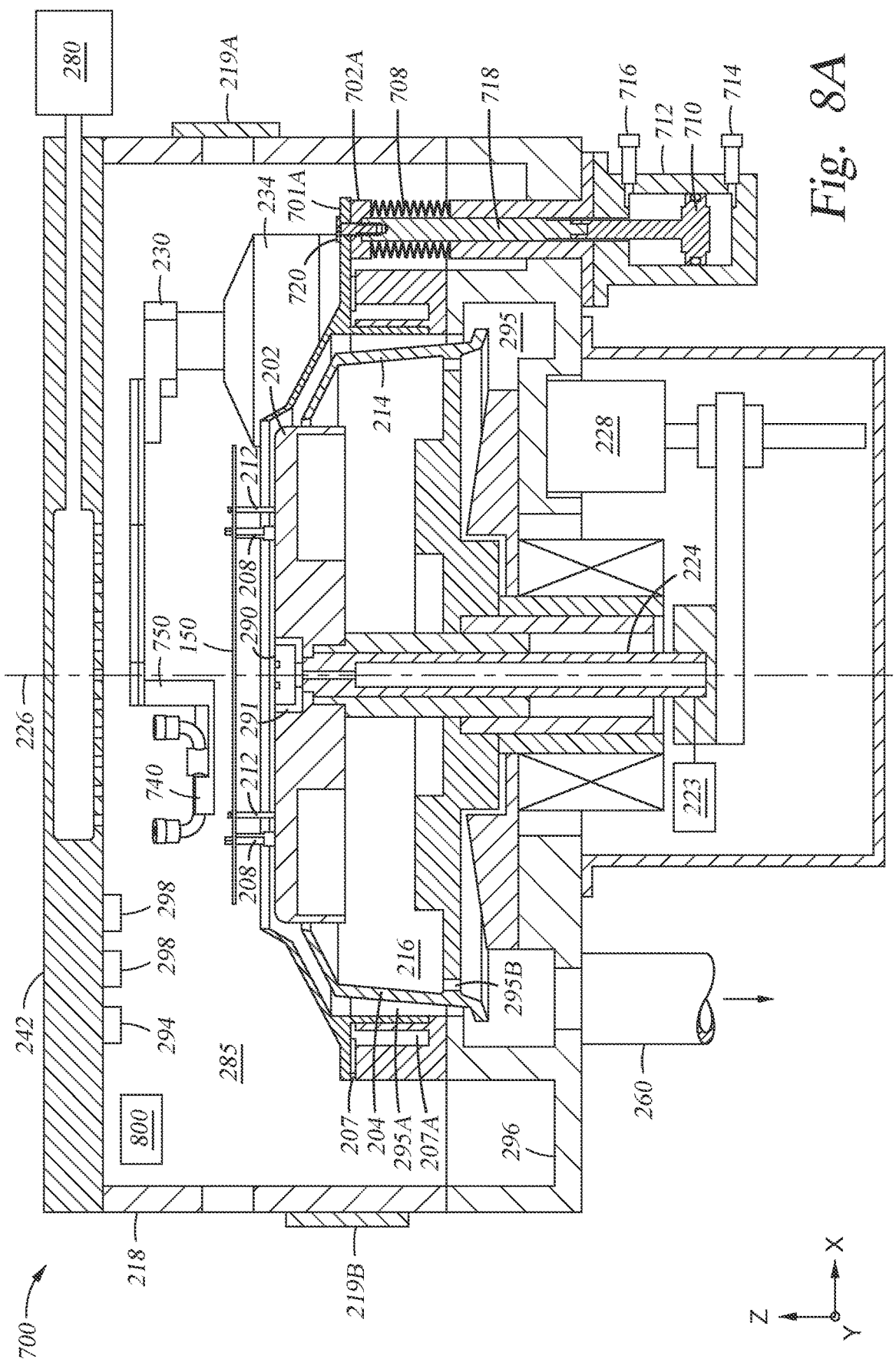
FIG. 8A is a cross-sectional view of the ICD module of FIGS. 7A, 7B, with the rotor cover in the lowered position, according to one or more embodiments.
Figure 8B:
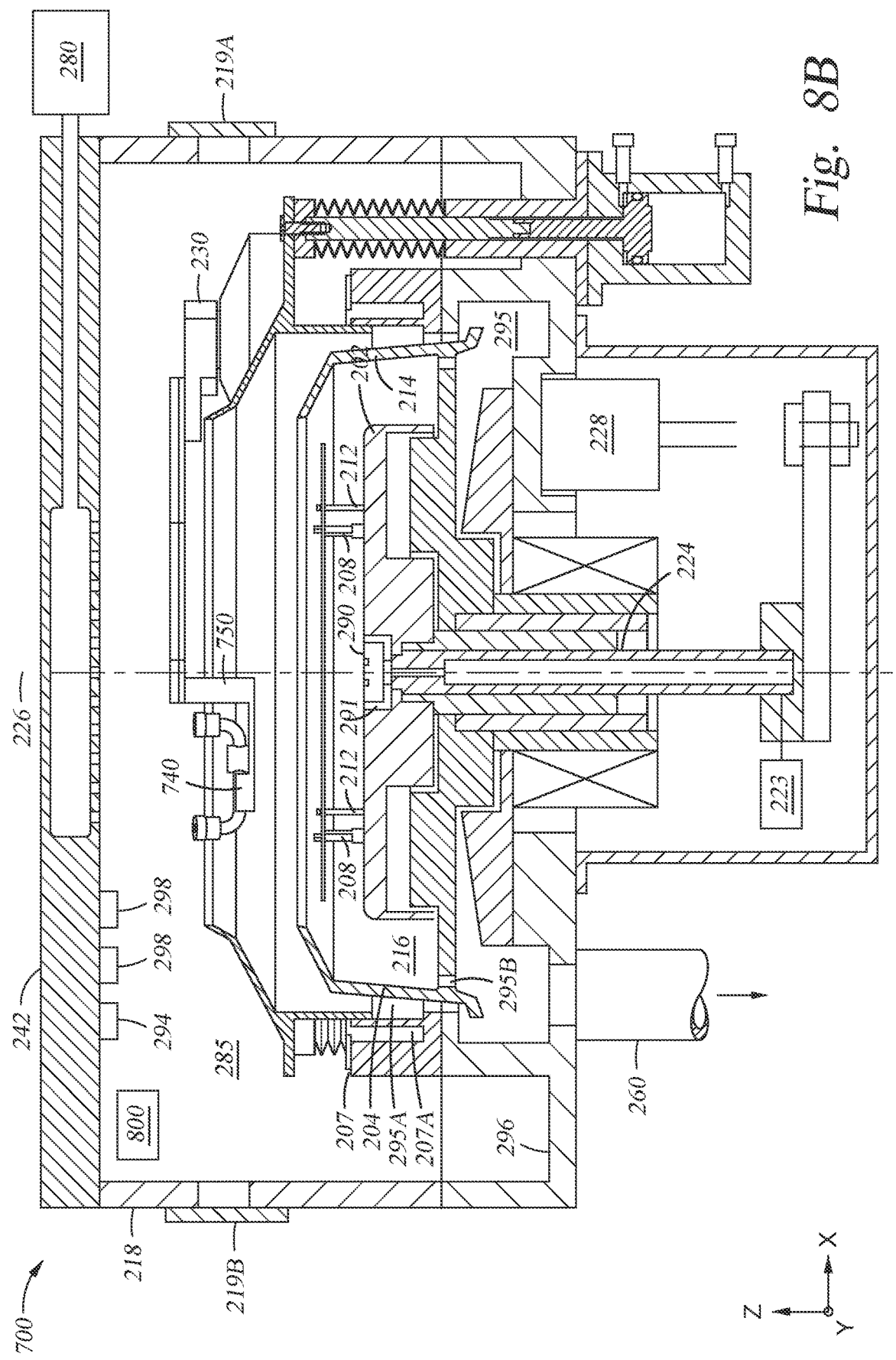
FIG. 8B is another cross-sectional view similar to FIG. 8A, with the rotor cover in the raised position, according to one or more embodiments.

One or more of the lifters 702A-C include an actuator, such as an air cylinder, ball-screw assembly, or linear motor that is coupled to the rotor cover 706. According to an embodiment, a portion of each of the lifters 702A-C extends below the drip pan 296. Alternatively, the lifters 702A-C may utilize one or more other lifting mechanisms, such as, for example, hydraulic cylinders or direct drive lifters. FIGS. 8A and 8B show, inter alia, a cross-section of lifter 702A, which can be understood as illustrating an actuator the includes a pneumatic air cylinder and being representative of the other lifters 702B, C.

As shown, lifter 702A includes a push rod 718, which is connected at an upper end thereof to flange 701A by a fastener 720. According to embodiments, the fastener 720 (and all other fasteners and hardware exposed to the interior volume 285 and the processing volume 216) may be formed of a non-metallic material to, for example, minimize susceptibility to corrosion. A lower end of the push rod 718 may be connected to a lifter piston 710. The lifter piston 710 is slidingly positioned in a lifter cylinder 712. The lifter cylinder 712 includes a first pneumatic channel 714 in communication with a portion of the lifter cylinder 712 below the lifter piston 710. The lifter cylinder 712 also includes a second pneumatic channel 716 in communication with a portion of the lifter cylinder 712 above the lifter piston 710. The first pneumatic channel 714 and second pneumatic channel 716 are connected to a pneumatic controller (not shown), which is controlled by, for example, controller 190 to apply positive and/or negative air pressure to the first pneumatic channel 714 and second pneumatic channel 716, thereby raising and lowering lifter piston 710 and (by extension through push rod 718) rotor cover 706 as required. For example, according to embodiments, the rotor cover 706 may be raised in the Z-direction by approximately 50 mm, and lowered by the same amount.

Figure 7A:
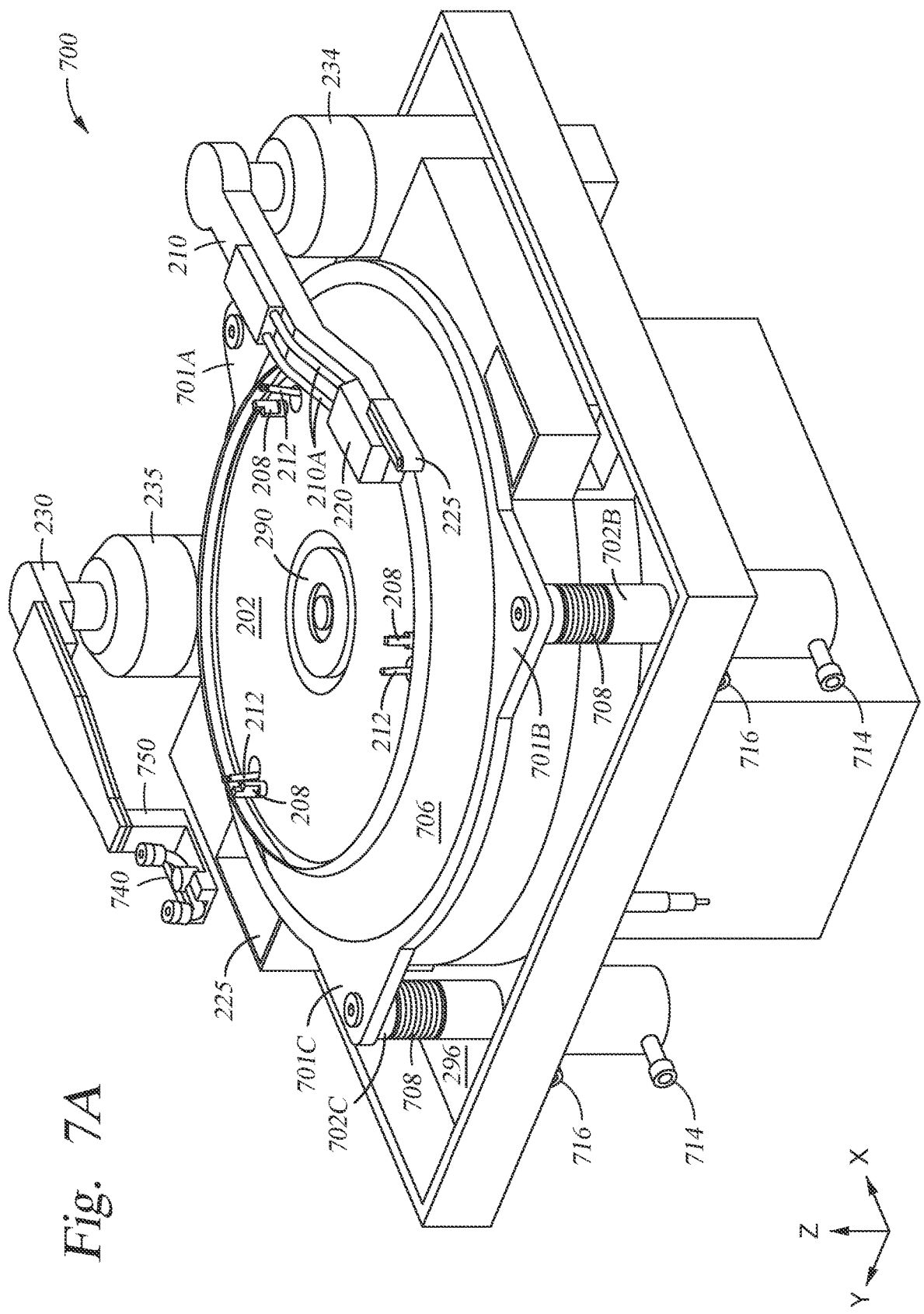
FIG. 7A is a top perspective view of an alternate embodiment of an ICD module with a rotor cover thereof in a lowered position, and with an enclosure thereof omitted, according to one or more embodiments.
Figure 7B:
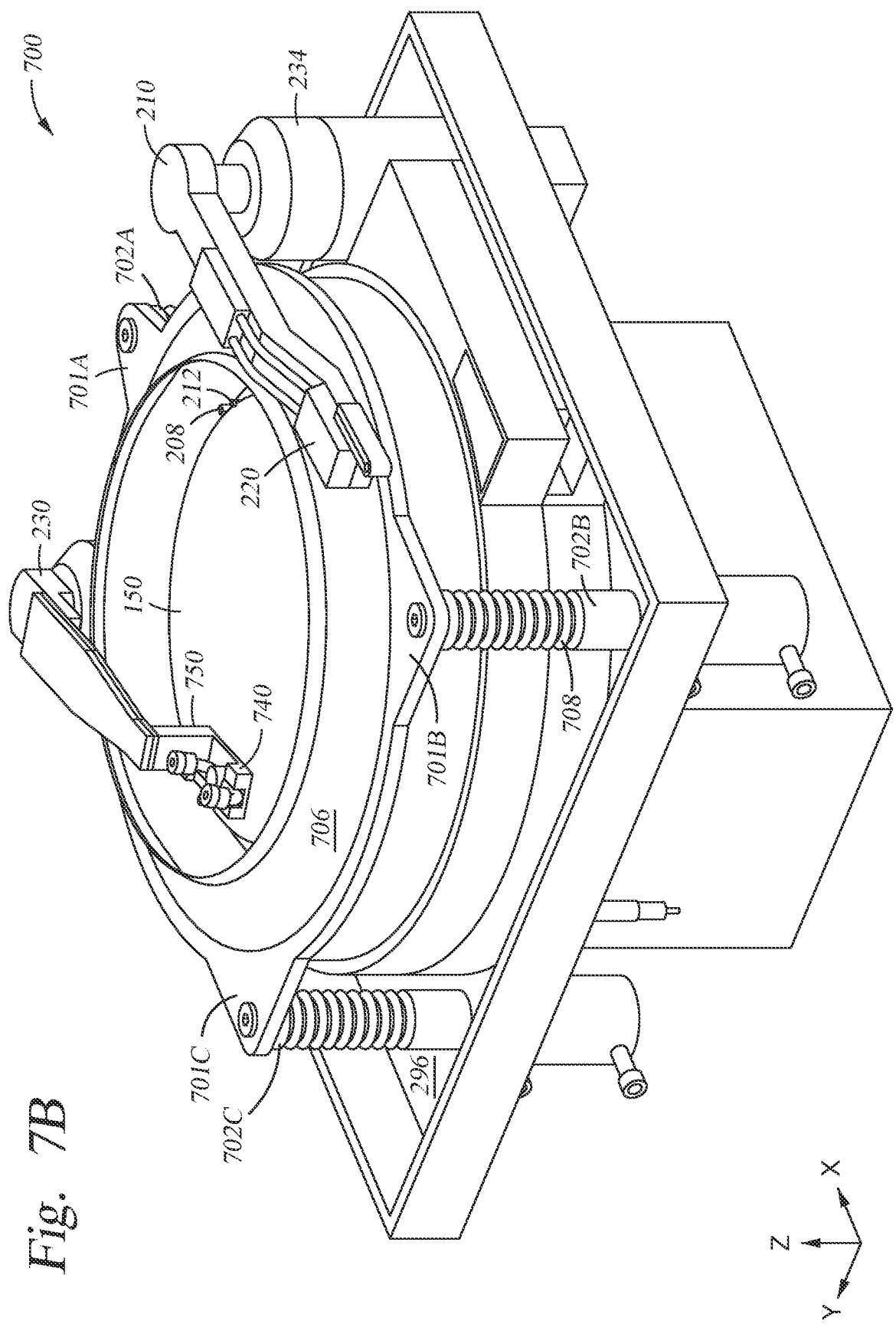
FIG. 7B is another top perspective view similar to FIG. 7A, with the rotor cover in a raised position, according to one or more embodiments.

In the embodiment of FIGS. 7A, 7B, 8A, and 8B, the second sweep arm 230 includes an alternate nozzle mechanism 740. The alternate nozzle mechanism 740 may be, for example, a droplet jet nozzle. However, the alternate nozzle mechanism 740 may any suitable type of nozzle mechanism, such as described above in connection with second nozzle mechanism 240. The alternate nozzle mechanism 740 may be connected to the second sweep arm 230 via a drop neck 750. As shown in FIGS. 7B and 8B, during cleaning, rinsing and drying processing of the substrate 150, the lifters support the rotor cover 706 in the raised position, while (as described above) the process rotor 202 is in the lowered position. Accordingly, the drop neck 750 allows the alternate nozzle mechanism 740 to be positioned as close to the substrate 150 as required for cleaning and/or rinsing processing of the substrate 150 while maintaining adequate clearance between the second sweep arm 230 and the top of the rotor cover 706.

As discussed above, the second sweep arm drive motor 235 is configured to move the second sweep arm 230 in an arcuate path that is parallel to a surface of the wafer 150, during the cleaning process, such that the cleaning fluids output by the alternate nozzle mechanism 740 are evenly distributed over the surface of the substrate 150. The second sweep arm drive motor 235 may also be configured to move the second sweep arm 230 axially to set a distance between the alternate nozzle mechanism 740 and the surface of the substrate 150.

According to one or more embodiments, the alternate ICD module 700 (instead of ICD module 200) may be utilized in connection with the method 600 described above. For example, in addition to the specific operation steps described above in connection with FIG. 6, the rotor cover 706 may be raised and lowered during such steps.

For example, according to an embodiment, at operation 610 of method 600, placing the alternate ICD module 700 in the first substrate transfer position may further include controlling the lifters 702A-C to lower the rotor cover 706 to the lowered position shown in FIGS. 7A and 8A. The controller 190 may provide instructions to, for example, the lifters 702A-C in connection with placing the alternate ICD module 700 in the first substrate loading position. In some embodiments, the controller 190, by use of an actuator within the lifters 702A-C, is configured to control the position of the rotor cover 706 relative to the collection rotor 204 so that the rotor cover 706 is in a first position (FIG. 8A) relative to the collection rotor 204 when the ICD module 700 is in the first substrate loading position.

At operation 620 of method 600, a substrate 150 may be received in the alternate ICD module 700 for cleaning and drying processing as described above.

At operation 630 of method 600, the alternate ICD module 700 and the substrate 150 held therein may be placed in the substrate cleaning and drying position. In an embodiment, placing the alternate ICD module 700 in the substrate cleaning and drying position may further include controlling the lifters 702A-C to raise the rotor cover 706 to the raised position shown in FIGS. 7B and 8B. The controller 190 may provide instructions to, for example, the lifters 702A-C in connection with placing the alternate ICD module 700 in the substrate cleaning and drying position. In some embodiments, the controller 190, by use of an actuator within the lifters 702A-C, is configured to control the position of the rotor cover 706 relative to the collection rotor 204 so that the rotor cover 706 is in a second position (FIG. 8B) relative to the collection rotor 204 when the process rotor 202 is positioned in a cleaning and drying position (e.g., lowered position) for performing a substrate cleaning process on a substrate.

At operation 640 of method 600, the alternate ICD module 700 may perform a cleaning process on the substrate 150 held therein in the substrate cleaning and drying position. For example and as described above, the second sweep arm motor 235 may rotate the second sweep arm 230 and alternate nozzle mechanism 740 through a predetermined angle sweep over the substrate 150 held on the process rotor 202 by the grip pins 212. Additionally, for example and as described above, the second drive motor 228 and/or the second sweep arm motor 235 may also adjust a distance in the Z direction between the alternate nozzle mechanism 740 and the upper surface of the substrate 150 to a predetermined distance. Additionally, for example, the alternate nozzle mechanism 740 may apply one or more fluids in a droplet jet stream to the upper surface of the substrate 150 while the substrate 150 is rotated by the process rotor 202 and while the second sweep arm 230 is rotated through the predetermined angle sweep. When the cleaning process is complete, the second sweep arm motor 235 may rotate the second sweep arm 230 so that the alternate nozzle mechanism 740 is positioned in its corresponding nozzle cup 225. According to embodiments, for example, the controller 190 may provide instructions to the first drive motor 222, the second drive motor 228, the second sweep arm motor 235, the lifters 702A-C and/or the alternate nozzle mechanism 740 in connection with performing the cleaning process on the substrate 150.

At operation 650 of method 600, the alternate ICD module 700 may perform the final rinse and dry process on the substrate 150 held therein in the substrate cleaning and drying position, as described above.

At operation 660, the alternate ICD module 700 may be placed in the second substrate transfer position, similar to the first substrate transfer position. For example, according to an embodiment, at operation 610 of method 600, placing the alternate ICD module 700 in the second substrate transfer position may further include controlling the lifters 702A-C to lower the rotor cover 706 to the lowered position shown in FIGS. 7A and 8A. The controller 190 may provide instructions to, for example, the lifters 702A-C in connection with placing the alternate ICD module 700 in the second substrate loading position. In some embodiments, the controller 190, by use of an actuator within the lifters 702A-C, is configured to control the position of the rotor cover 706 relative to the collection rotor 204 so that the rotor cover 706 is in the first position (FIG. 8A) relative to the collection rotor 204 when the ICD module 700 is in the second substrate loading position.

At operation 670, the substrate 150 may be transferred from the alternate ICD module 700 to the factory interface 102, as described above. Additionally, at operation 680, the alternate ICD module may perform a post-cleaning and drying process and drying process after the substrate 150 is removed. For example, the second sweep arm motor 235 may move the second sweep arm 230 so that the alternate nozzle mechanism 240 is at a position corresponding to a circumferential position of the stand-off pins 208 and the grip pins 212. Further, the alternate nozzle mechanism 740 may apply a drying fluid such as air or other gas while the first drive motor 222 rotates the process rotor 202 in order to dry the stand-off pins 208 and the grip pins 212.

Figure 9:
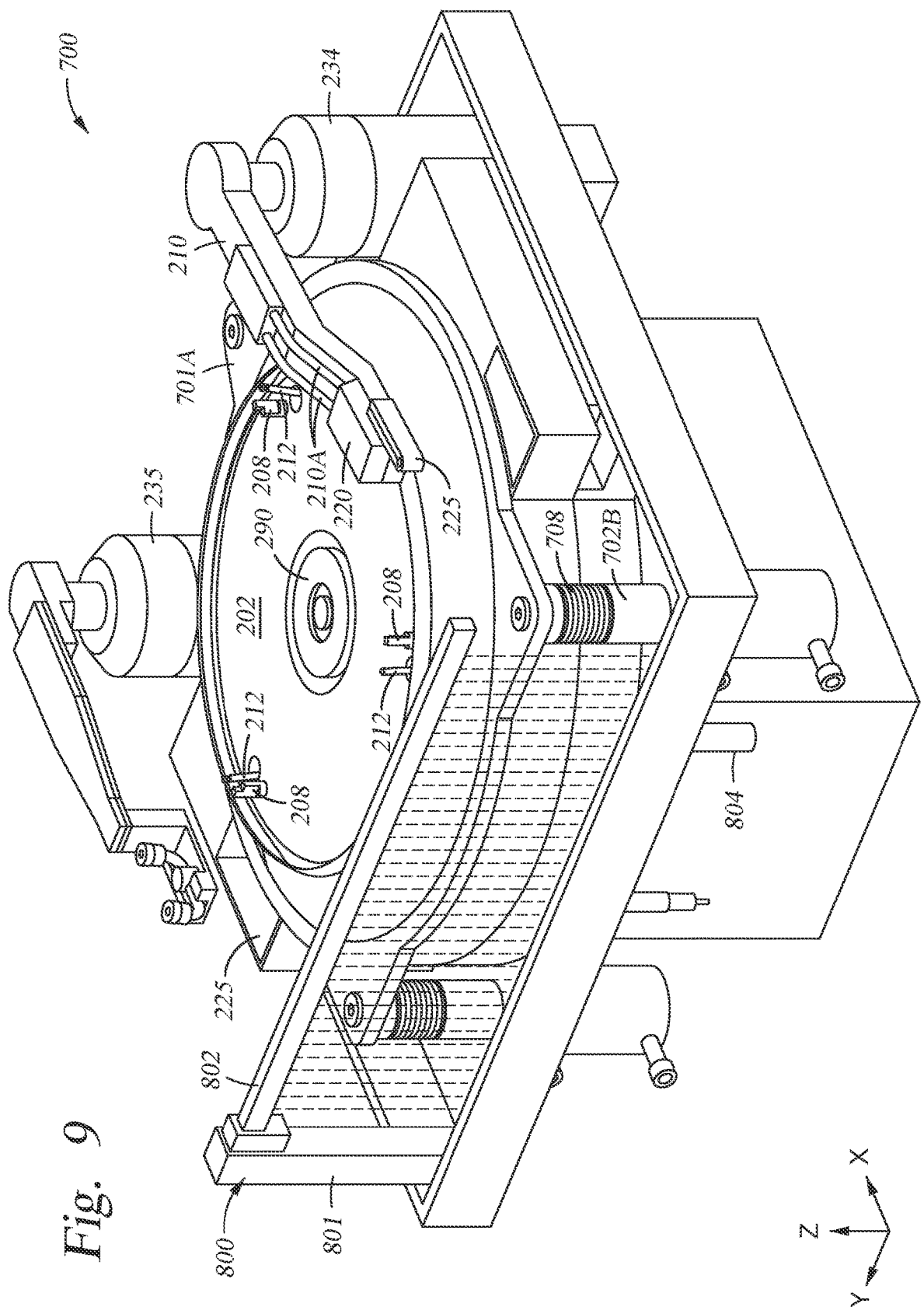
FIG. 9 is a top perspective view of another alternate embodiment of an ICD module with a spray bar, and with an enclosure thereof omitted, according to one or more embodiments.

The alternate ICD module 700 may include a spray bar 800, as shown in FIG. 9. While the spray bar 800 is described herein in connection with alternate ICD module 700, the spray bar 800 may also be applicable to the embodiments described above in connection with ICD module 200. According to embodiments, the spray bar 800 may be positioned proximate the door 219A, i.e., proximate to the interior of the cleaning unit 106. Accordingly, the spray bar 800 may apply a fluid (e.g., DI water) to a substrate 150 that is transferred into the alternate ICD module 700 by the second substrate handler 112.

The spray bar 800 may include vertical support 801 and fluid applicator 802. The vertical support 801 may include one or more fluid supply lines to supply fluid to the fluid applicator 802. For example, the vertical support 801 may be in fluid communication with inlet connections 292 to supply fluid to the fluid applicator 802. The fluid applicator 802 may be configured to apply fluid, via a linear array of holes in a bottom thereof, to a substrate 150 being transferred into the alternate ICD module. According to embodiments, the fluid applicator 802 is configured to apply fluid with a laminar (i.e., non-turbulent) flow onto the substrate 150 so as to minimize splashing of the applied fluid. The fluid may be collected in the drip pan 296 and drained via drip pan drain 804. Thus, according to embodiments, the spray bar 800 may provide for improved final rinsing and drying of the substrate 150 by pre-applying a rinsing fluid to the substrate 150 prior to placement of the substrate 150 on the process rotor 202.

While the foregoing is directed to embodiments of the present disclosure, other and further embodiments of the disclosure may be devised without departing from the basic scope thereof, and the scope thereof is determined by the claims that follow.

What is claimed is:

1. A cleaning and drying module comprising:
    a process rotor having a plurality of grip pins configured to releasably hold a substrate, the process rotor being configured to rotate and to move between a lowered position and a raised position;
    a plurality of sweep arms, each sweep arm having a nozzle mechanism configured to apply a fluid to the substrate;
    a collection rotor configured to rotate synchronously with the process rotor and defining a processing volume between the process rotor and an interior of the collection rotor, the collection rotor comprising:
        a sidewall extending above the process rotor in the lowered position, an inner surface of the sidewall being angled inward from a lower portion to an upper portion,
        a plurality of drain holes positioned proximate the lower portion of the inner surface of the sidewall, the drain holes configured to drain fluid from the processing volume; and
        a rotor extension extending diagonally downward and outward from a lower end of the sidewall, the rotor extension positioned proximate the drain holes;
    an annular collection weir formed below an outer portion of the collection rotor, the annular collection weir being configured to collect fluid from the drain holes, wherein the rotor extension extends into the annular collection weir;
    a rotor cover surrounding and extending above the sidewall of the collection rotor defining an annular volume between the rotor cover and the collection rotor, the plurality of grip pins of the process rotor extending above the rotor cover when positioned in the raised position; and
    an exhaust in communication with the annular collection weir, the exhaust configured to draw air from the processing volume and the annular volume through the drain holes and to receive the collected fluid from the annular collection weir.

2. The cleaning and drying module of claim 1, further comprising:
    an enclosure covering the process rotor, the collection rotor, the rotor cover and the sweep arms; and
    a fan filter unit mounted to the enclosure and configured to provide a positive air flow through the processing volume, the annular volume, and the drain holes, to the exhaust.

3. The cleaning and drying module of claim 1, further comprising:
    a second exhaust, wherein:
    the rotor cover comprises an annular duct having a plurality of vent openings providing fluid communication between an exterior surface of the rotor cover and the annular duct.

4. The cleaning and drying module of claim 1, wherein each gripping pin of the plurality of gripping pins includes a respective protruding element configured to contact the inner surface of the collection rotor when the process rotor is moved to the raised position, thereby moving the gripping pin from a substrate gripping position to a substrate release position.

5. The cleaning and drying module of claim 1, wherein:
the plurality of sweep arms comprises a first sweep arm and a second sweep arm,
the nozzle mechanism of the first sweep arm comprises a megasonic nozzle configured to apply megasonic energy to the fluid applied to the substrate, and
the nozzle mechanism of the second sweep arm comprises a drying nozzle configured to apply an isopropyl alcohol vapor to the substrate.

6. The cleaning and drying module of claim 1, further comprising:
an underside nozzle mechanism provided in the process rotor and configured to apply at least one of a cleaning fluid and a rinsing fluid to a backside of the substrate held by the gripping pins.

7. The cleaning and drying module of claim 1, further comprising:
an actuator that is coupled to the rotor cover and is configured to position the rotor cover relative to the collection rotor.

8. A cleaning and drying module comprising:
a process rotor having a plurality of grip pins configured to releasably hold a substrate, the process rotor being configured to rotate and to move between a lowered position and a raised position;
at least one sweep arm having a nozzle mechanism configured to apply a fluid to the substrate;
a collection rotor configured to rotate synchronously with the process rotor and defining a processing volume between the process rotor and an interior of the collection rotor, the collection rotor comprising:
a sidewall extending above the process rotor in the lowered position, an inner surface of the sidewall being angled inward from a lower portion to an upper portion,
a plurality of drain holes positioned proximate the lower portion of the inner surface of the sidewall, the drain holes configured to drain fluids and particles from the processing volume; and
a rotor extension extending diagonally downward and outward from a lower end of the sidewall, the rotor extension positioned proximate the drain holes;
an annular collection weir formed below an outer portion of the collection rotor, the annular collection weir being configured to collect the fluid and particles from the drain holes, wherein the rotor extension extends into the annular collection weir;
a rotor cover surrounding and extending above the sidewall of the collection rotor defining an annular volume between the rotor cover and the collection rotor, the plurality of grip pins of the process rotor extending above the rotor cover when positioned in the raised position;
an exhaust in communication with the annular collection weir, the exhaust configured to draw air from the processing volume and the annular volume through the drain holes and to receive the collected fluid and particles from the annular collection weir; and
an enclosure covering the process rotor, the collection rotor, the rotor cover and the sweep arms, the enclosure comprising:
a first door on a first side of the enclosure, and
a second door on a second side of the enclosure different from the first side.

9. The cleaning and drying module according to claim 8, wherein:
a controller, by use of an actuator, is configured to control the position of the rotor cover relative to the collection rotor so that the rotor cover is in a first position relative to the collection rotor during a loading or an unloading process, and in a second position relative to the collection rotor when the process rotor is positioned in the lowered position for performing a substrate cleaning process on a substrate.

10. The cleaning and drying module according to claim 9, further comprising:
the controller is further configured to control the process rotor so that:
during the loading and unloading processes, the process rotor is in the raised position, and
during the substrate cleaning process, the process rotor is in at least one of the lowered position and an intermediate position between the raised position and the lowered position.

11. The cleaning and drying module according to claim 10, wherein:
the process rotor has a plurality of stand-off pins,
during the loading and unloading processes, the plurality of grip pins are positioned a distance from an edge of the substrate and the substrate is supported on the plurality of stand-off pins.

12. The cleaning and drying module according to claim 8, further comprising:
an actuator that is coupled to rotor cover and is configured to position the rotor cover relative to the collection rotor.

13. The cleaning and drying module according to claim 8, wherein the collection rotor further comprises a rotor extension extending diagonally downward and outward from a lower end of the sidewall, the rotor extension positioned proximate the drain holes.

14. The cleaning and drying module of claim 8, further comprising:
an enclosure covering the process rotor, the collection rotor, the rotor cover and the sweep arms; and
a fan filter unit mounted to the enclosure and configured to provide a positive air flow through the processing volume, the annular volume, and the drain holes, to the exhaust.

15. The cleaning and drying module of claim 8, further comprising:
a second exhaust, wherein:
the rotor cover comprises an annular duct having a plurality of vent openings providing fluid communication between an exterior surface of the rotor cover and the annular duct.

16. The cleaning and drying module of claim 8, wherein:
the at least one sweep arm comprises a first sweep arm and a second sweep arm,
the nozzle mechanism of the first sweep arm comprises a megasonic nozzle configured to apply megasonic energy to the fluid applied to the substrate, and
the nozzle mechanism of the second sweep arm comprises a drying nozzle configured to apply an isopropyl alcohol vapor to the substrate.

* * * * *